United States Patent
Huang et al.

(10) Patent No.: US 12,300,753 B2
(45) Date of Patent: May 13, 2025

(54) THIN FILM TRANSISTOR AND ARRAY SUBSTRATE EACH HAVING ACTIVE LAYER COMPRISING MULTIPLE OXIDE LAYERS ARRANGED IN A STACK

(71) Applicant: BOE Technology Group Co., Ltd., Beijing (CN)

(72) Inventors: Jie Huang, Beijing (CN); Ce Ning, Beijing (CN); Zhengliang Li, Beijing (CN); Hehe Hu, Beijing (CN); Jiayu He, Beijing (CN); Nianqi Yao, Beijing (CN); Feng Qu, Beijing (CN); Xiaochun Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 344 days.

(21) Appl. No.: 17/780,877

(22) PCT Filed: May 27, 2021

(86) PCT No.: PCT/CN2021/096450
§ 371 (c)(1),
(2) Date: May 27, 2022

(87) PCT Pub. No.: WO2021/258982
PCT Pub. Date: Dec. 30, 2021

(65) Prior Publication Data
US 2023/0015871 A1 Jan. 19, 2023

(30) Foreign Application Priority Data
Jun. 24, 2020 (CN) .......................... 202010591838.8

(51) Int. Cl.
*H01L 29/786* (2006.01)
*H01L 27/12* (2006.01)

(52) U.S. Cl.
CPC .... *H01L 29/78696* (2013.01); *H01L 27/1225* (2013.01); *H01L 29/7869* (2013.01)

(58) Field of Classification Search
CPC .......... H01L 29/78696; H01L 27/1225; H01L 29/7869
See application file for complete search history.

(56) References Cited

U.S. PATENT DOCUMENTS 9,899,536 B2   2/2018   Yamazaki et al.
10,741,696 B2   8/2020   Suzuki et al.
(Continued)

FOREIGN PATENT DOCUMENTS

CN   102194887 A   9/2011
CN   102867854 A   1/2013
(Continued)

OTHER PUBLICATIONS

Jun. 1, 2023—(EP)—Extended European Search Report Appn 21830212.3.
(Continued)

*Primary Examiner* — Michael Jung
(74) *Attorney, Agent, or Firm* — Banner & Witcoff, Ltd.

(57) ABSTRACT

A thin film transistor, a manufacturing method thereof, an array substrate and an electronic device are provided. The thin film transistor includes an active layer including multiple oxide layers which includes a channel layer, a transition layer and a first barrier layer, the channel layer is an layer with a highest carrier mobility, the channel layer is a crystalline or amorphous oxide layer, the transition layer is in direct contact with the channel layer, the first barrier layer is an outermost oxide layer, the first barrier layer and the transition layer are both crystalline oxide layers; a crystallization degree of the first barrier layer and a crystallization degree of the transition layer are greater than a crystalliza-
(Continued)

tion degree of the channel layer, and a band gap of the first barrier layer and a band gap of the transition layer are larger than a band gap of the channel layer.

20 Claims, 12 Drawing Sheets

(56) References Cited

U.S. PATENT DOCUMENTS

| | | | |
|---|---|---|---|
| 2011/0215328 A1 | 9/2011 | Morosawa et al. | |
| 2014/0103334 A1 | 4/2014 | Xie et al. | |
| 2014/0103346 A1 | 4/2014 | Yamazaki | |
| 2014/0131700 A1* | 5/2014 | Yamazaki | H01L 27/1214 257/43 |
| 2014/0138675 A1 | 5/2014 | Yamazaki | |
| 2014/0151685 A1 | 6/2014 | Tokunaga et al. | |
| 2014/0225105 A1 | 8/2014 | Tanaka et al. | |
| 2014/0306221 A1 | 10/2014 | Yamazaki et al. | |
| 2015/0060846 A1* | 3/2015 | Yamamoto | H01L 29/24 257/43 |
| 2015/0155362 A1* | 6/2015 | Nakazawa | H01L 29/78648 257/43 |
| 2015/0243738 A1* | 8/2015 | Shimomura | H01L 29/045 252/519.1 |
| 2017/0373135 A1 | 12/2017 | Yamazaki et al. | |
| 2018/0040739 A1 | 2/2018 | Woo et al. | |
| 2018/0254352 A1* | 9/2018 | Koezuka | G06F 3/0412 |
| 2019/0097059 A1 | 3/2019 | Kikuchi et al. | |
| 2021/0313473 A1 | 10/2021 | Yamazaki et al. | |
| 2021/0343752 A1 | 11/2021 | Liu et al. | |

FOREIGN PATENT DOCUMENTS

| | | |
|---|---|---|
| CN | 104882486 A | 9/2015 |
| CN | 105679766 A | 6/2016 |
| CN | 107516661 A | 12/2017 |
| CN | 107591316 A | 1/2018 |
| CN | 109585455 A | 4/2019 |
| CN | 110190063 A | 8/2019 |
| CN | 110534577 A | 12/2019 |
| CN | 211957649 U | 11/2020 |
| KR | 20130101750 A | 9/2013 |
| WO | 2018061969 A1 | 4/2018 |

OTHER PUBLICATIONS

Dec. 28, 2024 (CN) Office Action application 202010591838.8 with English Translation.

* cited by examiner

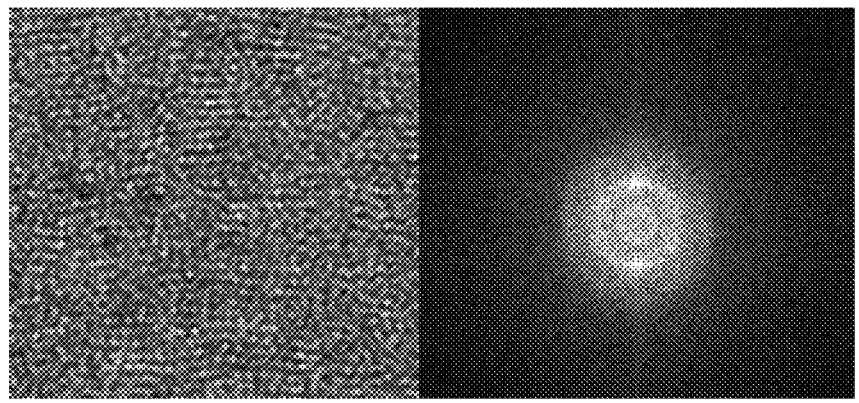
FIG. 4C                    FIG. 4D
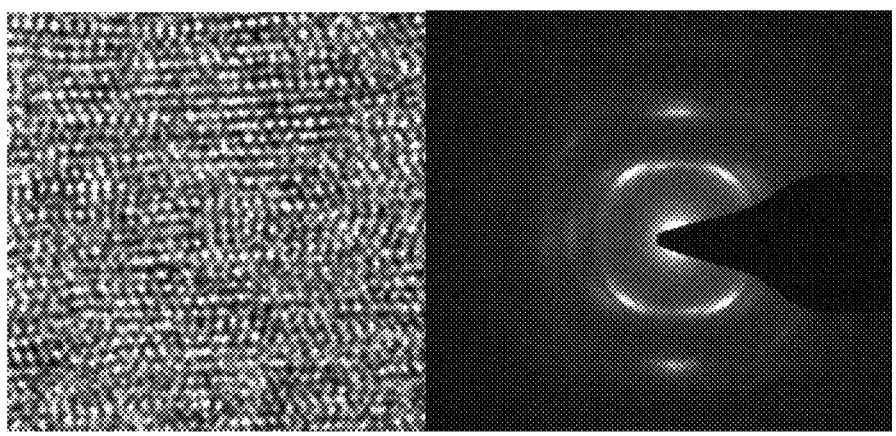
FIG. 4E                    FIG. 4F
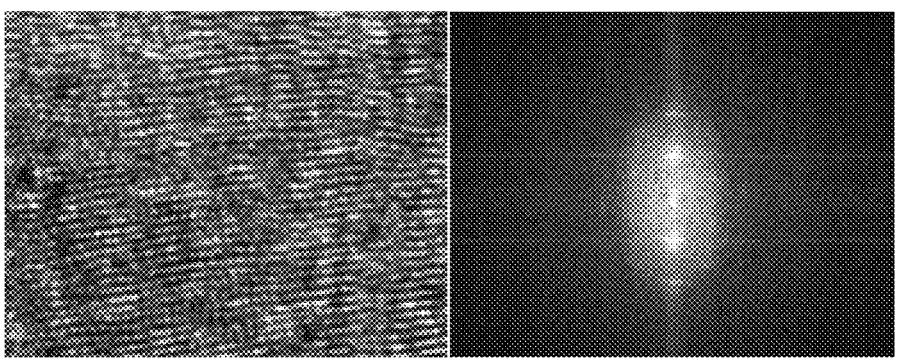
FIG. 4G                    FIG. 4H

US 12,300,753 B2

THIN FILM TRANSISTOR AND ARRAY SUBSTRATE EACH HAVING ACTIVE LAYER COMPRISING MULTIPLE OXIDE LAYERS ARRANGED IN A STACK

The application is a U.S. National Phase Entry of International Application PCT/CN2021/096450, filed on May 27, 2021, designating the United States of America and claiming priority to Chinese Patent Application No. 202010591838.8 filed on Jun. 24, 2020. The present application claims priority to and the benefit of the above-identified applications and the above-identified applications are incorporated by reference herein in their entirety.

TECHNICAL FIELD

Embodiments of the present disclosure relates to a thin film transistor, a manufacturing method thereof, an array substrate and an electronic device.

BACKGROUND

Thin film transistor (TFT) is the core component of a display, whether the display is AMLCD (Active Matrix Liquid Crystal Display) or AMOLED (Active Matrix Organic Light-Emitting Diode) display, each pixel of the display relies on the thin film transistor for switching or driving. According to different semiconductor materials of an active layer of the thin film transistor, the thin film transistors can be categorized into amorphous silicon thin film transistor, low temperature polysilicon thin film transistor and oxide thin film transistor.

The oxide thin film transistors are considered to be most likely to be used in the next generation flat panel display because of their high mobility, good large-area uniformity and low fabrication temperature.

SUMMARY

At least one embodiments of the present disclosure provides to a thin film transistor, a manufacturing method thereof, an array substrate and an electronic device, in which the thin film transistor has high mobility and high stability.

At least one embodiments of the present disclosure provides a thin film transistor, comprising: a substrate and an active layer provided on the substrate, wherein the active layer comprises multiple oxide layers arranged in a stack, the multiple oxide layers comprise a channel layer, a transition layer and a first barrier layer, the channel layer is an layer with a highest carrier mobility in the multiple oxide layers, the channel layer is a crystalline oxide layer or an amorphous oxide layer, the transition layer is in direct contact with the channel layer, the first barrier layer is an outermost oxide layer in the multiple oxide layers, and the first barrier layer and the transition layer are both crystalline oxide layers; a crystallization degree of the first barrier layer and a crystallization degree of the transition layer are both greater than a crystallization degree of the channel layer, and a band gap of the first barrier layer and a band gap of the transition layer are both larger than a band gap of the channel layer.

For example, a slope angle of the multiple oxide layers is in a range of 25°-65°.

For example, the transition layer is a first matching layer provided between the channel layer and the first barrier layer.

For example, a carrier concentration of the first matching layer is between a carrier concentration of the channel layer and a carrier concentration of the first barrier layer.

For example, a carrier mobility of the first matching layer is between a carrier mobility of the channel layer and a carrier mobility of the first barrier layer.

For example, a thickness of the first matching layer and a thickness of the channel layer are both smaller than a thickness of the first barrier layer.

For example, the first matching layer and the channel layer comprise same kinds of metal elements, and atomic number ratio of the metal elements in the first matching layer and atomic number ratio of the metal elements in the channel layer are the same.

For example, the first barrier layer and the first matching layer comprises same kinds of metal elements, and atomic number ratio of the metal elements in the first barrier layer and atomic number ratio of the metal elements in the first matching layer are different from each other.

For example, both the first matching layer and the first barrier layer are provided on a side of the channel layer facing away from the substrate; the channel layer is an amorphous or crystalline IGZO layer, the first matching layer and the first barrier layer are both crystalline IGZO layers, and In:Ga:Zn in each of the channel layer and the first matching layer is 4:2:3, and In:Ga:Zn in the first barrier layer is 1:3:6.

For example, the multiple oxide layers further comprise a second barrier layer, the second barrier layer is provided on a side of the channel layer facing towards the substrate, the first barrier layer is provided on a side of the channel layer facing away from the substrate, and a band gap of the second barrier layer is larger than the band gap of the channel layer.

For example, the second barrier layer is a crystalline oxide layer, and a crystallization degree of the second barrier layer is greater than the crystallization degree of the channel layer; the second barrier layer and the channel layer comprises same kinds of metal elements, and atomic number ratio of the metal elements in the second barrier layer and atomic number ratio of the metal elements in the channel layer are the same.

For example, the channel layer is a crystalline or amorphous IGZO layer, the second barrier layer, the first matching layer and the first barrier layer are all crystalline IGZO layers, In:Ga:Zn in each of the second barrier layer, the channel layer and the first matching layer is 4:2:3, and In:Ga:Zn in the first barrier layer is 1:3:6.

For example, the multiple oxide layers further comprise a second matching layer provided between the channel layer and the second barrier layer, the second matching layer is a crystalline oxide layer, and an crystallization degree of the second matching layer is between the crystallization degree of the channel layer and a crystallization degree of the second barrier layer; the second matching layer, the channel layer and the first matching layer comprise same kinds of metal elements and have same atomic number ratio.

For example, a thickness of the second matching layer is greater than a thickness of the first matching layer.

For example, the channel layer is an amorphous or crystalline IGZO layer, the second barrier layer, the second matching layer, the first matching layer and the first barrier layer are all crystalline IGZO layers, In:Ga:Zn in each of the second matching layer, the channel layer and the first matching layer is 4:2:3, and In:Ga:Zn in each of the first barrier layer and the second barrier layer is 1:3:6.

For example, the transition layer is a second barrier layer, the second barrier layer is provided on a side of the channel layer facing towards the substrate, the first barrier layer is provided on a side of the channel layer facing away from the substrate, and a band gap of the second barrier layer is larger than the band gap of the channel layer.

For example, the multiple oxide layers are three oxide layers which comprise the second barrier layer, the channel layer, and the first barrier layer; the first barrier layer, the channel layer, and the second barrier layer comprise same kinds of metal elements, and atomic number ratio of metal elements in the first barrier layer, atomic number ratio of the metal elements in the channel layer, and atomic number ratio of the metal elements in the second barrier layer are the same.

For example, the channel layer is an amorphous or crystalline IGZO layer, the second barrier layer and the first barrier layer are both crystalline IGZO layers, In:Ga:Zn in each of the second barrier layer, the channel layer and the first barrier layer is 4:2:3.

For example, the multiple oxide layers are three oxide layers which comprises the second barrier layer, the channel layer, and the first barrier layer; the channel layer is an amorphous or crystalline IGZO layer, the first barrier layer and the second barrier layer are both crystalline IGZO layers, and In:Ga:Zn in the channel layer is 4:2:3, In:Ga:Zn in each of the second barrier layer and the first barrier layer is 1:3:6.

For example, the first barrier layer is provided on a side of the channel layer facing away from the substrate, and a wettability of the first barrier layer to a photoresist is better than a wettability of a layer, which is in direct contact with the first barrier layer in the multiple oxide layers, to the photoresist.

For example, the active layer further comprises a sacrificial layer stacked with the multiple oxide layers, the sacrificial layer is provided on a side of the multiple oxide layers facing away from the substrate, a wettability of the sacrificial layer to a photoresist is better than a wettability of a surface of the multiple oxide layers in direct contact with the sacrificial layer to the photoresist.

For example, the thin film transistor further comprises a source electrode and a drain electrode on the substrate, the source electrode and the drain electrode are provided on a side of the sacrificial layer facing away from the substrate.

For example, the sacrificial layer is disconnected at a position between the source electrode and the drain electrode; and a thickness of the sacrificial layer is less than or equal to 100 angstroms.

For example, the sacrificial layer is selected from the group consisting of a metal oxide semiconductor layer and a metal sulfide semiconductor layer.

At least one embodiment of the disclosure provides array substrate, comprising the thin film transistor as described above.

For example, the array substrate comprises a display region and a gate driving circuit region on a periphery of the display region, wherein the array substrate comprises a plurality of the thin film transistors, the plurality of thin film transistors comprise a first thin film transistor in the display region and a second thin film transistor in the gate driving circuit region, a width-to-length ratio of the second thin film transistor is 12~150 times a width-to-length ratio of the first thin film transistor.

For example, the width-to-length ratio of the first thin film transistor is 0.5~2, and the width-to-length ratio of the second thin film transistor is 12.5~118.

For example, a width of the second thin film transistor is 1~500 times a width of the first thin film transistor, and a length of the second thin film transistor is 1.5 to 2 times a length of the first thin film transistor.

At least one embodiment of the disclosure provides an electronic device, comprising the thin film transistor as described above or the array substrate as described above.

At least one embodiment of the disclosure provides a manufacturing method of a thin film transistor, comprising: forming an active layer on a substrate, comprising forming multiple oxide layers arranged in a stack, wherein the multiple oxide layers are formed by using one single mask, the multiple oxide layers comprising a channel layer, a transition layer and a first barrier layer, the channel layer is an layer with a highest carrier mobility in the multiple oxide layers, the channel layer is a crystalline oxide layer or an amorphous oxide layer, the transition layer is in direct contact with the channel layer, the first barrier layer is an outermost oxide layer in the multiple oxide layers, the first barrier layer is a crystalline oxide layer; a crystallization degree of the first barrier layer is greater than a crystallization degree of the channel layer, and a band gap of the first barrier layer is larger than a band gap of the channel layer.

For example, the transition layer is a first matching layer, the first matching layer is provided between the channel layer and the first barrier layer, the first matching layer is a crystalline oxide layer, and a crystallization degree of the first matching layer is between the crystallization degree of the channel layer and the crystallization degree of the first barrier layer; the forming the multiple oxide layers comprises: forming the first matching layer and the channel layer by using same targets in a same vacuum chamber.

For example, the transition layer is a second barrier layer, the second barrier layer is provided on a side of the channel layer facing towards the substrate, the first barrier layer is provided on a side of the channel layer facing away from the substrate, and a band gap of the second barrier layer is larger than the band gap of the channel layer; the forming the multiple oxide layers comprises: forming the second barrier layer, the channel layer and the first barrier layer by using same targets in a same vacuum chamber.

For example, the forming the multiple oxide layers comprises: forming the channel layer in a first vacuum chamber, moving the substrate on which the channel layer is formed into a second vacuum chamber; and then, forming the first barrier layer in the second vacuum chamber, wherein during a procedure of moving the substrate on which the channel layer is formed into the second vacuum chamber, the first vacuum chamber and the second vacuum chamber communicate with each other.

For example, the active layer further comprises a sacrificial layer provided on a side of the multiple oxide layers facing away from the substrate, a wettability of the sacrificial layer to a photoresist is better than a wettability of a surface of the multiple oxide layers in direct contact with the sacrificial layer to the photoresist, and the sacrificial layer and the multiple oxide layers are formed by using the one single mask.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 4C and FIG. 4D are respectively a TEM image and a FFT transformed diffraction pattern in a case that the channel layer of the thin film transistor shown in FIG. 1D is the crystalline IGZO (423) layer;

FIG. 4E and FIG. 4F are respectively a TEM image and a diffraction pattern in a case that the first matching layer in the thin film transistor shown in FIG. 1D is the crystalline IGZO (423) layer;

FIG. 4G and FIG. 4H are respectively a TEM image and an FFT transformed diffraction pattern in a case that the first barrier layer in the thin film transistor shown in FIG. 1D is the crystalline IGZO (136) layer;

DETAILED DESCRIPTION

Figure 1A:
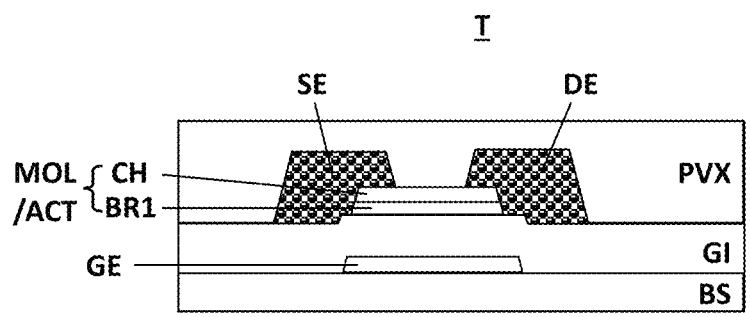
FIG. 1A to FIG. 1F are schematically structural diagrams of thin film transistors provided by embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and in a case that the position of the object which is described is changed, the relative position relationship may be changed accordingly.

In the current BCE (Back Channel Etch) oxide thin film transistor, a source electrode and a drain electrode are provided on a side of a channel layer facing away from the substrate. In the process of etching a metal layer used to form the source and drain electrodes by using an etchant, there is a situation that the channel layer is eroded by the etchant, and a large number of defects are formed in the channel layer due to the great damage of the etchant to the oxide of the channel layer. These defects capture a large number of working carriers in a case that the thin film transistor works, which leads to a significant decrease in the mobility and stability of the thin film transistor and seriously affects the characteristics of the thin film transistor. In addition, the channel layer and a gate electrode are separated by a gate insulating layer, and a side of the channel layer opposite to the side where the gate insulating layer is provided is provided with a passivation insulating layer; the gate insulating layer and the passivation insulating layer are both in direct contact with the channel layer, and some interface defects exist at the interface between each of the gate insulating layer and the passivation insulating layer and the channel layer. The interface defects capture a large number of working carriers in a case that the thin film transistor works, and these defects will also reduce the mobility and stability of the thin film transistor.

Embodiments of the present disclosure provide a thin film transistor and a manufacturing method of the same, an array substrate, and an electronic device. An active layer of the thin film transistor includes multiple oxide layers (i.e., multiple oxide semiconductor layers) arranged in a stack, and the multiple oxide layers includes a channel layer and a first barrier layer; the channel layer is the layer with the highest carrier mobility in the multiple oxide layers, and the channel layer is an amorphous oxide semiconductor layer or a crystalline oxide semiconductor layer; the first barrier layer is the outermost oxide layer in the multiple oxide layers (that is, the first barrier layer is the oxide layer closest to or farthest from the substrate in the multiple oxide layers), and the first barrier layer is a crystalline oxide semiconductor layer; the crystallization degree of the first barrier layer is greater than that of the channel layer, and the band gap of the first barrier layer is larger than that of the channel layer. The thin film transistor has high mobility and high stability.

In some embodiments, the active layer has a slope angle ranged from 25° to 75°, such as, from 25° to 65°. As an example, the slope angle of the active layer is 45° or approximately 45°, such as, 40°~50°. The slope angle of the active layer is an angle between an inclined side surface of the active layer and the substrate. By setting the slope angle in this way, the source electrode and the drain electrode can be better attached to the inclined side surface of the active layer ACT, so as to avoid disconnection of the source electrode and/or the drain electrode, thereby avoiding the occurrence of undercutting the active layer while the material for forming the source electrode and the drain electrode are etched; thus, the active layer has better characteristics and the stability of the thin film transistor is increased.

FIG. 1A to FIG. 1F are schematically structural diagrams of thin film transistors provided by embodiments of the present disclosure. As shown in FIG. 1A to FIG. 1F, the thin film transistor T provided by the embodiments of the present disclosure includes a substrate BS, a gate electrode GE, an active layer ACT, a source electrode SE and a drain electrode DE on the substrate BS. The source electrode SE and the drain electrode DE are electrically connected to the active layer ACT; for example, the source electrode SE and the drain electrode DE directly contact the active layer ACT to be electrically connected to the active layer ACT. In some embodiments, the thin film transistor T has a bottom-gate structure, that is, the gate electrode GE is provided on a side of the active layer ACT facing towards the substrate BS. In other embodiments, the thin film transistor T has a top-gate structure, that is, the gate electrode GE is provided on a side of the active layer ACT facing away from the substrate BS. In some embodiments, the source electrode SE and the drain electrode DE are provided on the side of the active layer ACT facing away from the substrate BS, or on the side of the active layer ACT facing towards the substrate BS. In some embodiments, the thin film transistor T further includes a first inorganic insulating layer GI, and the first inorganic insulating layer GI is provided on the side of the active layer ACT facing towards the substrate BS, that is, the first inorganic insulating layer GI is provided between the active layer ACT and the substrate BS in a direction perpendicular to the substrate BS; and directly contacts the active layer ACT, that is, the first inorganic insulating layer GI directly contacts the surface of the active layer ACT facing towards the substrate BS. In some embodiments, the first inorganic insulating layer GI of the thin film transistor T is provided on the side of the active layer ACT facing away from the substrate BS, that is, the active layer ACT is provided between the first inorganic insulating layer GI and the substrate BS in the direction perpendicular to the substrate BS; the first inorganic insulating layer GI directly contacts the active layer ACT, that is, the first inorganic insulating layer GI directly contacts the surface of the active layer ACT facing away from the substrate BS. In some embodiments, the thin film transistor T further includes a second inorganic insulating layer PVX, and the second inorganic insulating layer PVX is provided on the side of the active layer ACT facing away from the substrate BS, that is, the active layer ACT is provided between the second inorganic insulating layer PVX and the substrate BS in the direction perpendicular to the substrate BS; and the second inorganic insulating layer PVX directly contacts the active layer ACT, that is, the second inorganic insulating layer PVX directly contacts the surface of the active layer ACT facing away from the substrate BS.

The embodiments shown in FIG. 1A to FIG. 1F are described by taking the thin film transistor T as the bottom-gate structure and the source electrode SE and the drain electrode DE being provided on the side of the active layer ACT facing away from the substrate BS as an example.

Referring to FIG. 1A to FIG. 1F, the active layer ACT includes multiple oxide layers MOL arranged in a stack, and the multiple oxide layers MOL include a channel layer CH and a first barrier layer BR1; the first barrier layer BR1 is the outermost oxide layer of the multiple oxide layers MOL. In some embodiments, the first barrier layer BR1 is provided on a side of the channel layer CH facing towards the substrate BS (as shown in FIG. 1A), in this situation, the first barrier layer BR1 is the oxide layer of the multiple oxide layers MOL that is closest to the substrate BS. Alternatively, the first barrier layer BR1 is provided on a side of the channel layer CH facing away from the substrate BS (as shown in FIG. 1B to FIG. 1F), in this situation, the first barrier layer BR1 is the oxide layer of the multiple oxide layers MOL that is farthest from the substrate BS. The channel layer CH is the layer with the highest carrier mobility in the multiple oxide layers MOL. In some embodiments, the channel layer CH is the layer with the highest carrier mobility and highest carrier concentration in the multiple oxide layers MOL. The channel layer CH is an amorphous oxide layer or a crystalline oxide layer, and the first barrier layer BR1 is a crystalline oxide layer; the crystallization degree of the first barrier layer BR1 is greater than the crystallization degree of the channel layer CH, and the band gap of the first barrier layer BR1 is larger than the band gap of the channel layer CH. In some embodiments, the channel layer CH is the layer with the smallest band gap in the multiple oxide layers MOL, and the first barrier layer BR1 is the layer with the largest band gap in the multiple oxide layers MOL.

In the embodiments of the present disclosure, the channel layer CH has higher carrier mobility (e.g., Hall mobility) and smaller band gap, so the channel layer CH functions as a channel of the thin film transistor T. The crystallization degree of the first barrier layer BR1 is higher than that of the channel layer CH; in the case where the first barrier layer BR1 is provided on the side of the channel layer CH facing away from the substrate BS, the first barrier layer BR1 has the effects of: blocking the etchant used in the step of etching the material for forming the source electrode SE and the drain electrode DE from etching and damaging the channel layer CH, weakening the bombardment on the channel layer in a case that the second inorganic insulating layer PVX is deposited, preventing the diffusion of elements in the material used to form the source electrode SE and the drain electrode DE into the channel layer CH, or preventing the diffusion of impurity elements (such as the element H) into the channel layer CH, etc., thereby greatly increasing the protection for the channel layer CH. In the case where the thin film transistor T is at work, the carriers generated in the channel layer CH need to jump over the energy level barrier to transit to other layers; because the band gap of the channel layer CH is smaller and the band gap of the first barrier layer BR1 is larger, most of the carriers are confined inside the channel layer CH. In addition, compared with the case in which the channel layer CH directly contacts both the first inorganic insulating layer GI and the second inorganic insulating layer PVX, the first barrier layer BR1 with larger band gap, which is provided between the channel layer CH and the first inorganic insulating layer GI or the second inorganic insulating layer PVX in the embodiments of the present disclosure, can reduce the probability of carriers diffused from the channel layer CH to the interface of the channel layer CH and the first inorganic insulating layer GI or the second inorganic insulating layer, so as to reduce the influence of interface defects on the carriers, thereby increasing the stability of the thin film transistor T and the process feasibility of the manufacturing process. As a result, the embodiments of the present disclosure can effectively increase the carrier mobility and stability of the thin film transistor through combining multiple oxide layers MOL.

On the other hand, because all the layers (including the channel layer CH and the first barrier layer BR1) in the multiple oxide layers MOL are oxide semiconductor layers, the multiple oxide layers MOL for example are formed by the following steps: sequentially depositing multiple oxide films by using physical vapor deposition, and then performing a photolithography process; the photolithography process, for example, includes steps of: coating a photoresist on the multiple oxide films, and then exposing the multiple oxide films by using the same mask, next, developing the exposed photoresist to obtain a photoresist pattern, and finally etching the multiple oxide films by using the photoresist pattern to obtain the multiple oxide layers MOL. In this way, the total number of masks and the etching process are not increased, so that the production cost is not increased.

In at least one embodiment, the materials of the channel layer CH and the first barrier layer BR1 are metal oxides or metal oxynitrides including at least one element selected from the group of In, Ga, Zn, Sn, and Pr (lanthanoid), for example are at least one selected from the group of IGZO, IGTO, IGO, ITO, IGZTO, IZO, ZTO, InO, ZnON, Pr-IGZO, and the like. For example, the channel layer CH and the first barrier layer BR1 are metal oxide semiconductor layers or metal oxynitride semiconductor layers including at least one element selected from the group of In, Ga, Zn, Sn, and Pr (lanthanoid), for example are at least one selected from the group of IGZO layer, IGTO layer, IGO layer, ITO layer, IGZTO layer, IZO layer, ZTO layer, InO layer, ZnON layer, and Pr-IGZO layer. The metal elements included in the channel layer CH and the first barrier layer BR1 may be the same or different.

In the embodiments of the present disclosure, "crystalline oxide layer" means that the oxide layer mainly includes an oxide semiconductor in a crystalline phase state, and the oxide layer may further include little amorphous parts; "amorphous oxide layer" means that the oxide layer mainly includes an oxide semiconductor in an amorphous phase state, and the oxide layer may further include little crystalline phase parts (for example, crystallites with a particle size ranged from 1 nm to 20 nm).

For example, whether the oxide semiconductor layer is the crystalline oxide semiconductor layer or the amorphous oxide semiconductor layer is analyzed by XRD (X-ray Diffraction Analysis). XRD mainly has two parameters. One parameter is the peak position of the crystalline diffraction peak (the horizontal ordinate of the XRD pattern), which is used to qualitatively analyze the type of material, that is, the presence of crystalline peak in the oxide semiconductor layer within the specified diffraction angle range can prove that the layer is the crystalline layer (after the noise is removed from the XRD curve, a prominent crystal diffraction peak appearing in the continuous curve can prove crystallization). Taking the IGZO layer as an example, the crystalline peak at diffraction angle of 2 Deg. appearing in the range of 25° to 35° can indicate that the IGZO layer is the crystalline layer, and the appearance of the crystalline peak can prove that the layer is the crystalline layer. Another parameter is the shape of the crystallization peak (such as intensity (the vertical ordinate of the XRD pattern), the half-peak width, the integrated intensity of the crystallization peak, etc.), which is used to quantitatively analyze the properties of the crystalline.

For example, the crystalline state of each layer of the multiple oxide layers is also investigated by a TEM (transmission electron microscope) image of a cross section of the multiple oxide layers. The TEM image and the diffraction pattern or the FFT (Fast Fourier Transformation) conversion image also characterize whether the oxide semiconductor layer is the crystalline oxide semiconductor layer or the amorphous oxide semiconductor layer. For example, in the TEM image, the crystalline structure of the crystal is regularly arranged in a large area in the nanoscale range, while the amorphous structure has no obvious large-area arrangement in the nanoscale range; at the same time, in the FFT conversion image, the appearance of diffraction spots is considered to be crystalline, while the amorphous exhibits a non-obvious spot and has a ring-shaped diffraction pattern.

In addition, the composition of each layer in the multiple oxide layers is also analyzed by, for example, XPS (X-ray photoelectron spectroscopy), AES (Auger electron spectroscopy), or the like.

Figure 1B:
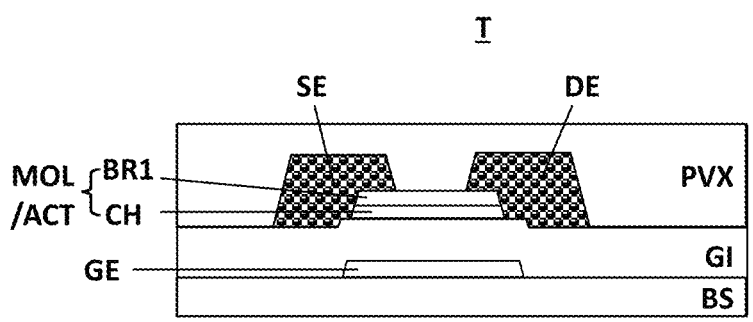
Figure 1C:
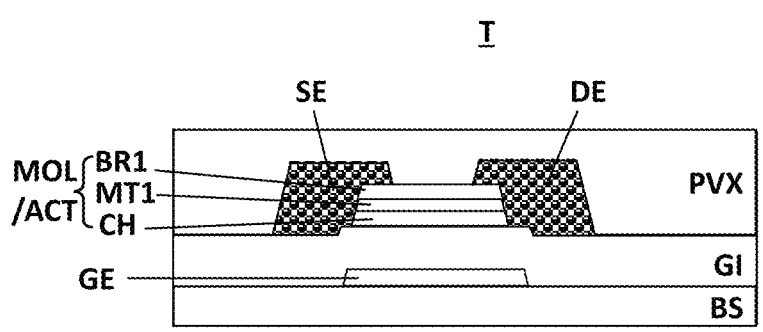
Figure 1D:
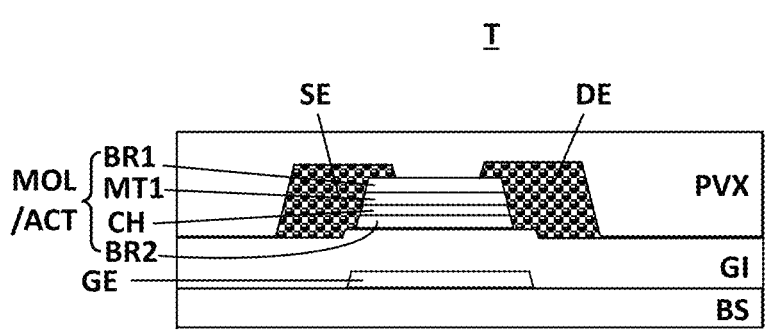
Figure 1E:
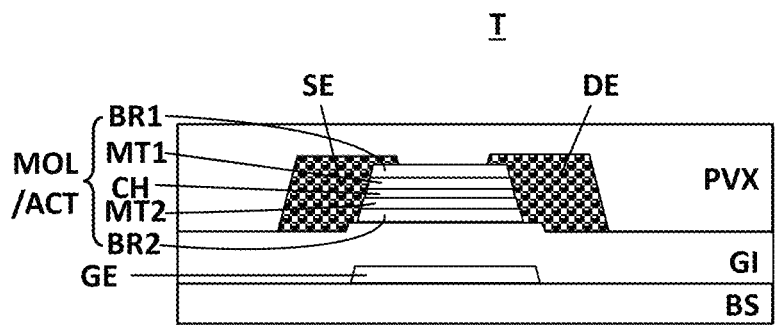
Figure 1F:
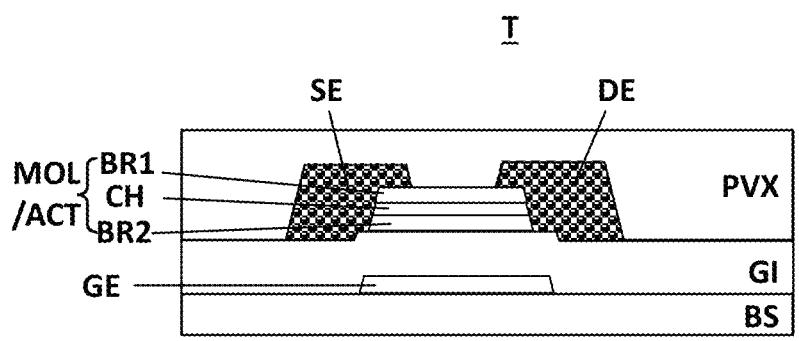

In some embodiments, as shown in FIG. 1A, FIG. 1B and FIG. 1F, the channel layer CH and the first barrier layer BR1 are in direct contact.

In some embodiments, in the case where the channel layer CH and the first barrier layer BR1 are in direct contact, the channel layer CH and the first barrier layer BR1 are of the identical type material, that is, the kinds of metal elements included in the channel layer CH and the first barrier layer BR1 are the same, and the atomic number ratio of the metal elements is the same. For example, both the channel layer CH and the first barrier layer BR1 are made of IGZO, and the atomic number ratio of In, Ga, and Zn in the channel layer CH is equal to the atomic number ratio of In, Ga, and Zn in the first barrier layer BR1. In one aspect, in the case where the channel layer CH and the first barrier layer BR1 are of the identical type material, the channel layer CH and the first barrier layer BR1 are deposited using the same targets in the same deposition chamber (that is, the channel layer CH and the first barrier layer BR1 are successively deposited in the same deposition chamber), in this way, after the deposition of one of the channel layer CH and the first barrier layer BR1 is finished, the other continues to be deposited without removing the finished one out of the deposition chamber, so that the finished one cannot be affected by the air out of the deposition chamber. In another aspect, in the case where the channel layer CH and the first barrier layer BR1 are of the identical type material, the lower oxide layer (the former deposited oxide layer) in the channel layer CH and the first barrier layer BR1 cannot be damaged due to the sputtering of the material used to form the upper oxide layer during the deposition of the upper oxide layer (the latter deposited oxide layer). In further another aspect, in the case where the channel layer CH and the first barrier layer BR1 are of the identical type material, the interface defects between the channel layer CH and the first barrier layer BR1 are less, so as to avoid interface defects such as lattice mismatch defects in a case that the channel layer CH is in direct contact with the first barrier layer BR1.

In at least one embodiment, in the case where the channel layer CH and the first barrier layer BR1 are of the identical type material, the thickness of the channel layer CH is 50 angstroms to 300 angstroms, and the thickness of the first barrier layer BR1 is 50 angstroms to 200 angstroms.

In at least another embodiment, in the case where the channel layer CH and the first barrier layer BR1 are in direct contact, the channel layer CH the first barrier layer BR1 include the same kinds of metal elements but the atomic number ratio of the metal elements are different in the channel layer CH and the first barrier layer BR1. For example, both the channel layer CH and the first barrier layer BR1 are IGZO layers, and the atomic number ratio of In, Ga, and Zn in the channel layer CH is different from that in the first barrier layer BR1.

In at least one embodiment, in the case where the channel layer CH and the first barrier layer BR1 include the same kinds of metal elements but have different atomic number ratios, the thickness of the channel layer CH is 50 angstroms to 300 angstroms, and the thickness of the first the barrier layer BR1 is 300 angstroms to 700 angstroms. By providing the first barrier layer BR1 with larger thickness, it is beneficial to improve the blocking capability of the first barrier layer BR1.

In some embodiments, the multiple oxide layers MOL further include a transition layer, the transition layer is provided on the side of the channel layer CH facing towards the substrate BS or on the side of the channel layer CH facing away from the substrate BS; the transition layer is in direct contact with the channel layer CH, the transition layer is a crystalline oxide layer, the crystallization degree of the transition layer is greater than that of the channel layer CH, and the band gap of the transition layer is larger than that of the channel layer CH. The transition layer at least plays a role in preventing the channel layer CH from directly contacting the first inorganic insulating layer GI or the second inorganic insulating layer PVX.

In some embodiments, as shown in FIG. 1C to FIG. 1E, the transition layer is the first matching layer MT1 which is included in the multiple oxide layers MOL of the thin film transistor T and provided between the channel layer CH and the first barrier layer BR1; the first matching layer MT1 is a crystalline oxide layer, and the crystallization degree of the first matching layer MT1 is between the crystallization degree of the channel layer CH and the crystallization degree of the first barrier layer BR1. Because the crystallization degree of the first matching layer MT1 is between the crystallization degree of the channel layer CH and the crystallization degree of the first barrier layer BR1, the first matching layer MT1 plays a role in matching the lattices of the channel layer CH and the first barrier layer BR1 so as to reduce interface defects.

In at least one embodiment, the band gap of the first matching layer MT1 is between the band gap of the channel layer CH and the band gap of the first barrier layer BR1. In this way, the first matching layer MT1 plays a role in blocking the diffusion of carriers in the channel layer CH. For example, the quantitative relationship among the bottom of the conduction band $|Ec|_{CH}$ and the top of the conduction band $|Ev|_{CH}$ of the material of the channel layer CH, the bottom of the conduction band $|Ec|_{MT1}$ and the top of the conduction band $|Ev|_{MT1}$ of the material of the first matching layer MT1, the bottom of the conduction band $|Ec|_{BR1}$ and the top of the conduction band $|Ev|_{BR1}$ of the material of the barrier layer BR1 is as follows: $|Ec|_{CH}>|Ec|_{MT1}>|Ec|_{BR1}$, $|Ev|_{CH}<|Ev|_{MT1}<|Ev|_{BR1}$. For example, the chemical potential (i.e., the Fermi level) of the first barrier layer BR1 is higher than that of the channel layer CH and that of the first matching layer MT1.

In the embodiments of the present disclosure, the first matching layer MT1 is an oxide semiconductor layer with relatively high crystallinity and relatively wide band gap, which can prevent the impurity elements (such as H) in the first inorganic insulating layer GI or the second inorganic insulating layer PVX from diffusing into the channel layer CH, thereby avoiding of the characteristic degradation of the thin film transistor T; on the other hand, because the first matching layer MT1 has larger band gap, the first matching layer MT1 also plays a role in preventing carriers in the channel layer CH from diffusing to the first inorganic insulating layer GI or the second inorganic insulating layer PVX.

In at least one embodiment, the carrier concentration of the first matching layer MT1 is between the carrier concentration of the channel layer CH and the carrier concentration of the first barrier layer BR1. That is, the carrier concentrations of the channel layer CH, the first matching layer MT1 and the first barrier layer BR1 gradually decrease.

In at least one embodiment, the carrier mobility of the first matching layer MT1 is between the carrier mobility of the channel layer CH and the carrier mobility of the first barrier layer BR1. That is, the carrier mobilities of the channel layer CH, the first matching layer MT1 and the first barrier layer BR1 gradually decrease.

In at least one embodiment, the material of the first matching layer MT1 is metal oxide or metal oxynitride including at least one element selected from the group of In, Ga, Zn, Sn, and Pr (lanthanoid), for example is at least one selected from the group of IGZO, IGTO, IGO, ITO, IGZTO, IZO, ZTO, InO, ZnON, Pr-IGZO and the like. For example, the first matching layer MT1 is a metal oxide semiconductor layer or a metal oxynitride semiconductor layer including at least one element selected from the group of In, Ga, Zn, Sn, and Pr (lanthanoid), for example is at least one selected from the group of IGZO layer, IGTO layer, IGO layer, ITO layer, IGZTO layer, IZO layer, ZTO layer, InO layer, ZnON layer, and Pr-IGZO layer. The metal elements included in the first matching layer MT1, the channel layer CH and the first barrier layer BR1 may be the same or different.

In at least one embodiment, the first matching layer MT1 is in direct contact with the channel layer CH and is of the identical type material, that is, the channel layer CH and the first matching layer MT1 include the same kinds of metal elements, and the atomic number ratios of the metal elements included in the channel layer CH and the first matching layer MT1 are the same. For example, both the channel layer CH and the first matching layer MT1 are IGZO layers, and the atomic number ratio of In, Ga, and Zn in the channel layer CH is equal to the atomic number ratio of In, Ga, and Zn in the first matching layer MT1. In one aspect, in the case where the channel layer CH and the first matching layer MT1 are in direct contact and are of the identical type material, the channel layer CH and the first matching layer MT1 are deposited using the same targets in the same deposition chamber (that is, the channel layer CH and the first matching layer MT1 are successively deposited in the same deposition chamber), in this way, after the deposition of one of the channel layer CH and the first matching layer MT1 is finished, the other continues to be deposited without removing the finished one out of the deposition chamber, so that the finished one cannot be affected by the air out of the deposition chamber. In another aspect, in the case where the channel layer CH and the first matching layer MT1 are of the identical type material, the lower oxide layer (the former deposited oxide layer) in the channel layer CH and the first matching layer MT1 cannot be damaged due to the sputtering of the material used to form the upper oxide layer during the deposition of the upper oxide layer (the latter deposited oxide layer). In further another aspect, in the case where the channel layer CH and the first matching layer MT1 are of the identical type material, the interface defects between the channel layer CH and the first matching layer MT1 are much lower than those in a case that the channel layer CH is in direct contact with the first barrier layer BR1, so that the interface defects such as lattice mismatch defects in a case that the channel layer CH is in direct contact with the first barrier layer BR1 can be effectively reduced.

In at least one embodiment, in the case that the first matching layer MT1 and the channel layer CH are in direct contact and are of the identical type material, the thickness of the channel layer CH is 50 angstroms to 300 angstroms, and the thickness of the first matching layer MT1 is 50 angstroms to 200 Angstroms. The thickness of the first matching layer MT1 should be relatively small to avoid affecting the light stability of the thin film transistor T; and in consideration of the mass productivity, the first matching layer MT1 with thin thickness can save time and reduce costs.

In at least one embodiment, the first matching layer MT1 and the first barrier layer BR1 include the same kinds of metal elements, but the first matching layer MT1 and the first barrier layer BR1 have different atomic number ratios of metal elements. For example, both the first matching layer MT1 and the first barrier layer BR1 are IGZO layers, and the atomic number ratio of In, Ga, and Zn in the first matching layer MT1 is different from the atomic number ratio of In, Ga, and Zn in the first barrier layer BR1.

In at least one embodiment, the thicknesses of the first matching layer MT1 and the channel layer CH are both smaller than the thickness of the first barrier layer BR1. For example, the thickness of the channel layer CH is 50 angstroms to 300 angstroms, the thickness of the first matching layer MT1 is 50 angstroms to 200 angstroms, and the thickness of the first barrier layer BR1 is 300 angstroms to 700 angstroms. By providing the first barrier layer BR1 with larger thickness, it is beneficial to improve the barrier capability of the first barrier layer BR1.

In some embodiments, as shown in FIG. 1D to FIG. 1F, the multiple oxide layers MOL in the thin film transistor T further include a second barrier layer BR2, and the second barrier layer BR2 is provided on the side of the channel layer CH facing towards the substrate BS. The first barrier layer BR1 is provided on the side of the channel layer CH facing away from the substrate BS, and the band gap of the second barrier layer BR2 is larger than that of the channel layer CH. In the case where the thin film transistor T is at work, the carriers generated in the channel layer CH need to jump over the energy level barrier; because the band gap of the channel layer CH is smaller and the band gaps of the second barrier layer BR2 and the first barrier layer BR1 are larger, most carriers are confined in the channel layer CH. In addition, compared with the case in which the channel layer CH directly contacts both the first inorganic insulating layer GI and the second inorganic insulating layer PVX, the second barrier layer BR2 with larger band gap, which is provided between the first inorganic insulating layer GI and the channel layer CH, and the first barrier layer BR1 with larger band gap, which is provided between the second inorganic insulating layer PVX and the channel layer CH in the embodiments of the present disclosure, can reduce the probability of carriers diffusing from the channel layer CH into the first inorganic insulating layer GI and the second inorganic insulating layer PVX respectively, so as to reduce the influence of interface defects on the carriers, thereby increasing the stability of the thin film transistor T and the process feasibility of the process procedure.

In at least one embodiment, the second barrier layer BR2 is a crystalline oxide layer, and the crystallization degree of the second barrier layer BR2 is greater than that of the channel layer CH. In this way, the blocking ability of the second barrier layer BR2 can be increased.

In at least one embodiment, the carrier concentration of the second barrier layer BR2 is less than that of the channel layer CH.

In at least one embodiment, the material of the second barrier layer BR2 is metal oxide or metal oxynitride including at least one element selected from the group of In, Ga, Zn, Sn, and Pr (lanthanoid), for example is at least one selected from the group of IGZO, IGTO, IGO, ITO, IGZTO, IZO, ZTO, InO, ZnON, Pr-IGZO and the like. For example, the second barrier layer BR2 is a metal oxide semiconductor layer or a metal oxynitride semiconductor layer including at least one element selected from the group of In, Ga, Zn, Sn, and Pr (lanthanoid), for example is at least one selected from the group of IGZO layer, IGTO layer, IGO layer, ITO layer, IGZTO layer, IZO layer, ZTO layer, InO layer, ZnON layer and Pr-IGZO layer. The kinds of metal elements included in the second barrier layer BR2, the channel layer CH, the first matching layer MT1 and the first barrier layer BR1 may be the same or different.

In at least one embodiment, the second barrier layer BR2 and the channel layer CH are in direct contact and are of the identical type material, that is, the second barrier layer BR2 and the channel layer CH include the same kinds of metal elements, and the second barrier layer BR2 and the channel layer CH have the same atomic number ratio of metal elements. For example, the channel layer CH and the second barrier layer BR2 are both IGZO layers, and the atomic number ratio of In, Ga, and Zn in the channel layer CH is equal to the atomic number ratio of In, Ga, and Zn in the second barrier layer BR2. In one aspect, in the case where the second barrier layer BR2 and the channel layer CH are in direct contact and are of the identical type material, the second barrier layer BR2 and the channel layer CH are deposited using the same targets in the same deposition chamber (that is, the second barrier layer BR2 and the channel layer CH are successively deposited in the same deposition chamber), in this way, after the deposition of the second barrier layer BR2 is finished, the channel layer CH continues to be deposited without removing the second barrier layer BR2 out of the deposition chamber, so that the second barrier layer BR2 cannot be affected by the air out of the deposition chamber. In another aspect, in the case where the second barrier layer BR2 and the channel layer CH are of the identical type material, the interface defects between the second barrier layer BR2 and the channel layer CH decreases.

In at least one embodiment, in the case where the second barrier layer BR2 and the channel layer CH are in direct contact and are of the identical type material, the thicknesses of the second barrier layer BR2 and the channel layer CH are 50 angstroms to 300 angstroms. For example, the thicknesses of the second barrier layer BR2 and the channel layer CH are approximately equal to each other.

In at least one embodiment, the second barrier layer BR2 and the channel layer CH include the same kinds of metal elements, but have different atomic number ratios of the metal elements. For example, both the second barrier layer BR2 and the channel layer CH are IGZO layers, and the atomic number ratio of In, Ga, and Zn in the second barrier layer BR2 is different from the atomic number ratio of In, Ga, and Zn in the channel layer CH.

In at least one embodiment, in the case where the second barrier layer BR2 and the channel layer CH include the same kinds of metal elements but have different atomic number ratios of the metal elements, the thickness of the channel layer CH is smaller than that of the second barrier layer BR2. For example, the thickness of the channel layer CH is 50 angstroms to 300 angstroms, and the thickness of the second barrier layer BR2 is 300 angstroms to 700 angstroms. By providing the second barrier layer BR2 with larger thickness, it is beneficial to improve the barrier capability of the second barrier layer BR2.

In at least one embodiment, as shown in FIG. 1E, the multiple oxide layers MOL in the active layer ACT of the thin film transistor T further include a second matching layer MT2 provided between the channel layer CH and the second barrier layer BR2; the second matching layer MT2 is a crystalline oxide layer, and the crystallization degree of the second matching layer MT2 is between the crystallization degree of the channel layer CH and the crystallization degree of the second barrier layer BR2. Because the crystallization degree of the second matching layer MT2 is between the crystallization degree of the channel layer CH and the crystallization degree of the second barrier layer BR2, the second matching layer MT2 can play the role of matching the lattices of the channel layer CH and the second barrier layer BR2 so as to reduce interface defects.

In at least one embodiment, the band gap of the second matching layer MT2 is between the band gap of the channel layer CH and the band gap of the second barrier layer BR2. In this way, the second matching layer MT2 plays a role in blocking the diffusion of carriers in the channel layer CH. For example, the quantitative relationship among the bottom of the conduction band $|Ec|_{CH}$ and the top of the conduction band $|Ev|_{CH}$ of the material of the channel layer CH, the bottom of the conduction band $|Ec|_{MT1}$ and the top of the conduction band $|Ev|_{MT1}$ of the material of the first matching layer MT1, the bottom of the conduction band $|Ec|_{MT2}$ and the top of the conduction band $|Ev|_{MT2}$ of the material of the second matching layer MT2, the bottom of the conduction band $|Ec|_{BR1}$ and the top of the conduction band $|Ev|_{BR1}$ of the material of the first barrier layer BR1, the bottom of the conduction band $|Ec|BR2$ and the top of the conduction band $|Ev|BR2$ of the material of the layer BR2 is as follows: $|Ec|_{CH}>|Ec|_{MT1}\approx|Ec|_{MT2}>|Ec|_{BR1}\approx|Ec|_{BR2}$, $|Ev|_{CH}<|Ev|_{MT1}\approx|Ev|_{MT2}<|Ev|_{BR1}\approx|Ev|_{BR2}$. For example, chemical potentials (i.e., the Fermi levels) of the first barrier layer BR1 and the second barrier layer BR2 are both higher than those of the channel layer CH, the first matching layer MT1 and the second matching layer MT2.

In the embodiments of the present disclosure, the second matching layer MT2 is an oxide semiconductor layer with relatively high crystallinity and relatively wide band gap, which can prevent impurity elements (such as H) in the first inorganic insulating layer GI or the second inorganic insulating layer PVX from diffusing into the channel layer CH, thereby avoiding the characteristic degradation of the thin film transistor T; on the other hand, because the second matching layer MT2 has larger band gap, the second matching layer MT2 also plays a role in preventing carriers in the channel layer CH from diffusing into the first inorganic insulating layer GI.

In at least one embodiment, the carrier concentration of the second matching layer MT2 is between the carrier concentration of the channel layer CH and the carrier concentration of the second barrier layer BR2. That is, the carrier concentrations of the channel layer CH, the second matching layer MT2 and the second barrier layer BR2 gradually decrease.

In at least one embodiment, the carrier mobility of the second matching layer MT2 is between the carrier mobility of the channel layer CH and the carrier mobility of the second barrier layer BR2. That is, the carrier mobilities of the channel layer CH, the second matching layer MT2 and the second barrier layer BR2 gradually decrease.

In at least one embodiment, the material of the second matching layer MT2 is metal oxide or metal oxynitride including at least one element selected from the group of In, Ga, Zn, Sn, and Pr (lanthanoid), for example is at least one selected from the group of IGZO, IGTO, IGO, ITO, IGZTO, IZO, ZTO, InO, ZnON, Pr-IGZO and the like. For example, the second matching layer MT2 is a metal oxide semiconductor layer or a metal oxynitride semiconductor layer including at least one element selected from the group of In, Ga, Zn, Sn, and Pr (lanthanoid), for example is at least one selected from the group of IGZO layer, IGTO layer, IGO layer, ITO layer, IGZTO layer, IZO layer, ZTO layer, InO layer, ZnON layer, and Pr-IGZO layer. The metal elements included in the second matching layer MT2, the channel layer CH and the second barrier layer BR2 may be the same or different.

In at least one embodiment, as shown in FIG. 1E, the second matching layer MT2 is in direct contact with the channel layer CH. In this situation, for example, the second matching layer MT2 and the channel layer CH are of the identical type material, that is, the channel layer CH and the second matching layer MT2 include the same kinds of metal elements and have the same atomic number ratio of the metal elements. For example, the channel layer CH and the second matching layer MT2 are both IGZO layers, and the atomic number ratio of In, Ga, and Zn in the channel layer CH is equal to the atomic number ratio of In, Ga, and Zn in the second matching layer MT2. In one aspect, in the case where the channel layer CH and the second matching layer MT2 are in direct contact and are of the identical type material, the channel layer CH and the second matching layer MT2 are deposited using the same targets in the same deposition chamber (that is, the channel layer CH and the second matching layer MT2 are successively deposited in the same deposition chamber), in this way, after the deposition of one of the channel layer CH and the second matching layer MT2 is finished, the other one continues to be deposited without removing the finished one out of the deposition chamber, so that the finished one cannot be affected by the air out of the deposition chamber. In another aspect, in the case where the second matching layer MT2 and the channel layer CH are of the identical type material, the interface defects between the second matching layer MT2 and the channel layer CH decrease.

In at least one embodiment, in the case where the second matching layer MT2 and the channel layer CH are in direct contact and are of the identical type material, the thicknesses of the second matching layer MT2 and the channel layer CH are 50 angstroms to 300 angstroms. For example, the thicknesses of the second matching layer MT2 and the channel layer CH are approximately equal to each other.

In at least one embodiment, the second matching layer MT2 and the second barrier layer BR2 include the same kinds of metal elements, but have different atomic number ratios of the metal elements. For example, both the second matching layer MT2 and the second barrier layer BR2 are IGZO layers, and the atomic number ratio of In, Ga, and Zn in the second matching layer MT2 is different from the atomic number ratio of In, Ga, and Zn in the second barrier layer BR2.

In at least one embodiment, the thicknesses of the second matching layer MT2 and the channel layer CH are less than the thickness of the second barrier layer BR2. For example, the thicknesses of the second matching layer MT2 and the channel layer CH are both 50 angstroms to 300 angstroms, and the thickness of the second barrier layer BR2 is 300 angstroms to 700 angstroms. By providing the second barrier layer BR2 with larger thickness, it is beneficial to improve the barrier capability of the second barrier layer BR2.

In at least one embodiment, the thickness of the second matching layer MT2 is greater than the thickness of the first matching layer MT1, so that the diffusion of carriers can be blocked more effectively, thereby improving stability.

In at least one embodiment, the transition layer included in the multiple oxide layers MOL is the second barrier layer BR2 provided on the side of the channel layer CH facing towards the substrate BS and directly contacting the channel layer CH. For example, as shown in FIG. 1F, both the first barrier layer BR1 and the second barrier layer BR2 are in direct contact with the channel layer CH. In this situation, for example, the first barrier layer BR1, the channel layer CH, and the second barrier layer BR2 are of the identical type material. That is, the first barrier layer BR1, the channel layer CH, and the second barrier layer BR2 include the same kinds of metal elements and have the same atomic number ratio of metal elements. For example, the second barrier layer BR2, the channel layer CH, and the first barrier layer BR1 are all IGZO layers, and the atomic number ratios of In, Ga, and Zn in the second barrier layer BR2, the channel layer CH, and the first barrier layer BR1 are equal to each other.

In one aspect, in the case where the first barrier layer BR1, the channel layer CH and the second barrier layer BR2 are of the identical type material, the first barrier layer BR1, the channel layer CH and the second barrier layer BR2 being of the identical type material are deposited using the same targets in the same deposition chamber (that is, the first barrier layer BR1, the channel layer CH and the second barrier layer BR2 are successively deposited in the same deposition chamber), in this way, after the deposition of the second barrier layer BR2, the channel layer CH continues to be deposited without removing the second barrier layer BR2 out of the deposition chamber; after the deposition of the channel layer CH is finished, the first barrier layer BR1 continues to be deposited without removing the channel layer CH out of the deposition chamber, so that the second barrier layer BR2 and the channel layer CH cannot be affected by the air out of the deposition chamber. In another aspect, because the channel layer CH and the first barrier layer BR1 are of the identical type material, the channel layer CH cannot be damaged due to the sputtering of the material used to form the first barrier layer BR1 during the deposition of the first barrier layer BR1 on the channel layer CH. In further another aspect, because the first barrier layer BR1, the channel layer CH and the second barrier layer BR2 are of the identical type materials, the interface defects between the second barrier layer BR2 and the channel layer CH and the interface defects between the channel layer CH and the first barrier layer BR1 decrease.

In some embodiments, the multiple oxide layers MOL have a double-layer structure. For example, as shown in FIG. 1A and FIG. 1B, the multiple oxide layers MOL include only two oxide semiconductor layers, namely the channel layer CH and the first barrier layer BR1. In this situation, in order to enable the thin film transistor to have higher mobility and stability, for example, the channel layer CH has the smallest band gap, the largest carrier concentration, the highest carrier mobility and the lowest crystallization degree; the first barrier layer BR1 is a crystalline oxide layer, the first barrier layer BR1 and the channel layer CH are non-identical materials including the same kinds of metal elements (for example, both are IGZO layers), and the thickness of the first barrier layer BR1 is greater than that of the channel layer CH. For example, the thickness of the channel layer CH is 50 angstroms to 300 angstroms, and the thickness of the first barrier layer BR1 is 300 angstroms to 700 angstroms.

In the case where the multiple oxide layers MOL adopt the double-layer structure as shown in FIG. 1A and FIG. 1B, for example, the channel layer CH is the IGZO layer, and the element ratio of the IGZO layer is: In≈35%-50%, Ga≈10%~40%, Zn≈20%~40%, so that the IGZO layer has a higher carrier concentration. It should be noted that the ratio of a certain metal element X (X is In, Ga or Zn) is the number of atoms of X divided by the sum of the number of atoms of In, Ga and Zn. For example, the channel layer CH is an IGZO (111) layer, an IGZO (423) layer, an IGZO (432) layer, an IGZO (312) layer, an IGZO (513) layer, an IGZO (534) layer, an IGZO (713) layer, an IGZO layer (624) layer or an IGZO (514) layer. In other embodiments, the channel layer CH is an IGZYO (Y represents Sn) layer, an IGTO layer, an ITZO layer, an IZO layer, an ITO layer, or the like. For example, the channel layer CH is an IGZO (423) layer, because the IGZO (423) material in the amorphous state has narrow band gap (for example, 2.5 eV-2.7 eV) and high carrier concentration (for example, $1 \times 10^{16}$-$9 \times 10^{16}$), and higher carrier Hall mobility (15 cm2/V·s –25 cm2/V·s). It should be noted that IGZO (abc) means that the atomic number ratio (In:Ga:Zn) of In, Ga, and Zn elements in the IGZO material is a:b:c, for example, the atomic number ratio (In:Ga:Zn) of the IGZO(423) is 4:2:3.

In the case where the multiple oxide layers MOL adopt the double-layer structure as shown in FIG. 1A and FIG. 1B, for example, the first barrier layer BR1 is the metal oxide semiconductor layer including two or more of the metal elements In, Ga, Zn, and Sn. For example, the first barrier layer is an IGZO layer (indium gallium zinc oxide layer), and the element ratio of the IGZO layer is: In≈7%-14%, Ga≈20%-40%, Zn≈50%-70%. It should be noted that the ratio of a certain metal element X (X is In, Ga or Zn) is the number of atoms of X divided by the sum of the number of atoms of In, Ga and Zn. For example, the first barrier layer BR1 is an IGZO (136) layer, an IGZO (132) layer, an IGZO (243) layer, or an IGZO (153) layer. In other embodiments, the first barrier layer BR1 is an IGO layer, an ITZO layer or the like.

In consideration of the interaction between the double layers of oxide as shown in FIG. 1A and FIG. 1B and the property of the material of each layer, for example, in the embodiment shown in FIG. 1A and FIG. 1B, the channel layer CH is an amorphous IGZO (423) layer or a crystalline IGZO (423) layer, and the first barrier layer BR1 is a crystalline IGZO (136) layer.

In some embodiments, the multiple oxide layers MOL have a three-layer structure (as shown in FIG. 1C and FIG. 1F).

For example, as shown in FIG. 1C, the multi-layer oxide MOL includes only three oxide semiconductor layers, namely the channel layer CH, the first matching layer MT1 and the first barrier layer BR1; both the first matching layer MT1 and the first barrier layer BR1 are provided on the side of the channel layer CH facing away from the substrate BS. In order to enable the thin film transistor to have higher mobility and stability, for example, the channel layer CH has the smallest band gap, the largest carrier concentration, the highest carrier mobility and the lowest crystallization degree; the crystallization degree, the band gap, the carrier mobility and the carrier concentration of the first matching layer MT1 are all between those of the channel layer CH and those of the first barrier layer BR1; the first matching layer MT1 and the channel layer CH are of the identical type material; the first matching layer MT1 and the first barrier layer BR1 are both crystalline oxide layers and are of non-identical materials including the same kinds of metal elements; and the thickness of the first barrier layer BR1 is greater than that of the first matching layer MT1 and that of the channel layer CH. For example, the thickness of the channel layer CH is 50 angstroms to 300 angstroms, the thickness of the first matching layer MT1 is 50 angstroms to 200 angstroms, and the thickness of the first barrier layer BR1 is 300 angstroms to 700 angstroms.

In the case where the multiple oxide layers MOL adopt the three-layer structure as shown in FIG. 1C, for example, both the channel layer CH and the first matching layer MT1 are IGZO layers, and the element ratio of the IGZO layer is: In≈35% –50%, Ga≈10%~40%, Zn≈20%~40%, so that the IGZO layer has a higher carrier concentration. It should be noted that the ratio of a certain metal element X (X is In, Ga or Zn) is the number of atoms of X divided by the sum of the number of atoms of In, Ga and Zn. For example, both the channel layer CH and the first matching layer MT1 are IGZO (111) layers, IGZO (423) layers, IGZO (432) layers, IGZO (312) layers, IGZO (513) layers, and IGZO (534) layers, IGZO (713) layers, IGZO (624) layers or IGZO (514) layers. In other embodiments, both the channel layer CH and the first matching layer MT1 are IGZYO (Y represents Sn) layers, IGTO layers, ITZO layers, IZO layers, ITO layers, or the like.

In the case where the multiple oxide layers MOL adopt the three-layer structure as shown in FIG. 1C, for example, the first barrier layer BR1 is the metal oxide semiconductor layer including two or more of the metal elements In, Ga, Zn, and Sn. For example, the first barrier layer is an IGZO layer (indium gallium zinc oxide layer), and the element ratio of the IGZO layer is: In≈7%-14%, Ga≈20%-40%, Zn≈50%-70%. It should be noted that the ratio of a certain metal element X (X is In, Ga or Zn) is the number of atoms of X divided by the sum of the number of atoms of In, Ga and Zn. For example, the first barrier layer BR1 is an IGZO (136) layer, an IGZO (132) layer, an IGZO (243) layer, and an IGZO (153) layer. In other embodiments, the first barrier layer BR1 is an IGO layer or an ITZO layer or the like.

In consideration of the interaction between the three layers of oxide as shown in FIG. 1C and the property of the material of each layer, for example, in the embodiment shown in FIG. 1C, the channel layer CH is an amorphous IGZO (423) layer or a crystalline IGZO (423) layer, the first matching layer MT1 is a crystalline IGZO (423) layer, and the first barrier layer BR1 is a crystalline IGZO (136) layer.

For example, as shown in FIG. 1F, the multiple oxide layers MOL include only three oxide semiconductor layers of the second barrier layer BR2, the channel layer CH and the first barrier layer BR1, which are sequentially provided on the substrate BS. In order to enable the thin film transistor to have high mobility and stability, for example, the channel layer CH has the smallest band gap, the largest carrier concentration, the highest carrier mobility and the lowest crystallization degree; the second barrier layer BR2 and the first barrier layer BR1 are crystalline oxide layers; and the second barrier layer BR2, the channel layer CH and the first barrier layer BR1 are of the identical type material.

For example, in the case where the multiple oxide layer MOL adopts the three-layer structure as shown in FIG. 1F, for example, the second barrier layer BR2, the channel layer CH and the first barrier layer BR1 are all IGZO layers, and the element ratio of the IGZO layer is: In≈35%-50%, Ga≈10%~40%, Zn≈20%~40%, so that the IGZO layer has a higher carrier concentration. It should be noted that the ratio of a certain metal element X (X is In, Ga or Zn) is the number of atoms of X divided by the sum of the number of atoms of In, Ga and Zn. For example, the second barrier layer BR2, the channel layer CH and the first barrier layer BR1 are all IGZO (111) layers, IGZO (423) layers, IGZO (432) layers, IGZO (312) layers, and IGZO (513) layers, IGZO (534) layers, IGZO (713) layers, IGZO (624) layers or IGZO (514) layers. In other embodiments, the second barrier layer BR2, the channel layer CH, and the first barrier layer BR1 are all IGZYO (Y represents Sn) layers, IGTO layers, ITZO layers, IZO layers, ITO layers, or the like.

In consideration of the interaction between the three layers of oxides as shown in FIG. 1F and the property of the material of each layer, in the embodiment shown in FIG. 1F, in the case where the second barrier layer BR2, the channel layer CH and the first barrier layer BR1 are the identical type material, for example, the channel layer CH is an amorphous IGZO (423) layer or a crystalline IGZO (423) layer, and the second barrier layer BR2 and the first barrier layer BR1 are both crystalline IGZO (423) layers.

In at least another embodiment, in the case where the multiple oxide layers MOL adopt the three-layer structure as shown in FIG. 1F, the channel layer CH has the smallest band gap, the largest carrier concentration, the highest carrier mobility, and the lowest crystallization degree, the channel layer CH and each of the second barrier layer BR2 and the first barrier layer BR1 are of the non-identical materials including the same kinds of metal elements, and the thicknesses of the second barrier layer BR2 and the first barrier layer BR1 are larger than the thickness of the channel layer CH. For example, in the case where each of the second barrier layer BR2 and the first barrier layer BR1 and the channel layer CH are non-identical materials including the same kinds of metal elements, the thickness of the channel layer CH is 50 angstroms to 300 angstroms, and the thicknesses of the second barrier layer BR2 and the first barrier layer BR1 are both 300 angstroms to 700 angstroms.

In the case where the multiple oxide layers MOL adopt the three-layer structure as shown in FIG. 1F and the channel layer CH and each of the second barrier layer BR2 and the first barrier layer BR1 are of the non-identical materials including the same kinds of metal elements, for example, the channel layer CH is an IGZO layer, and the element ratio of the IGZO layer is: In≈35%-50%, Ga≈10%~40%, Zn≈20%~40%, so that the IGZO layer has a higher carrier concentration. It should be noted that the ratio of a certain metal element X (X is In, Ga or Zn) is the number of atoms of X divided by the sum of the number of atoms of In, Ga and Zn. For example, the channel layer CH is an IGZO (111) layer, an IGZO (423) layer, an IGZO (432) layer, an IGZO (312) layer, an IGZO (513) layer, an IGZO (534) layer, an IGZO (713) layer, an IGZO layer (624) layer or an IGZO (514) layer. In other embodiments, the channel layer CH is an IGZYO (Y represents Sn) layer, an IGTO layer, an ITZO layer, an IZO layer, an ITO layer, or the like.

In the case where the multiple oxide layers MOL adopt the three-layer structure as shown in FIG. 1F and the channel layer CH and each of the second barrier layer BR2 and the first barrier layer BR1 are of the non-identical materials including the same kinds of metal elements, for example, the second barrier layer BR2 and the first barrier layer BR1 are metal oxide semiconductor layers including two or more of metal elements In, Ga, Zn, and Sn. For example, the second barrier layer BR2 and the first barrier layer BR1 are IGZO layers (indium gallium zinc oxide layers), and the element ratio of the IGZO layer is: In≈7%-14%, Ga≈20%~40%, Zn≈50%~70%. It should be noted that the ratio of a certain metal element X (X is In, Ga or Zn) is the number of atoms of X divided by the sum of the number of atoms of In, Ga and Zn. For example, the second barrier layer BR2 and the first barrier layer BR1 are IGZO (136) layers, IGZO (132) layers, IGZO (243) layers, and IGZO (153) layers. In other embodiments, the second barrier layer BR2 and the first barrier layer BR1 are IGO layers, ITZO layers or the like.

In consideration of the interaction between the three layers of oxides as shown in FIG. 1F and the property of the material of each layer, in the embodiment shown in FIG. 1F and in the case where the channel layer CH and each of the second barrier layer BR2 and the first barrier layer BR1 are of the non-identical materials including the same kinds of metal elements, for example, the channel layer CH is an amorphous IGZO (423) layer or a crystalline IGZO (423) layer, and the second barrier layer BR2 and the first barrier layer BR1 are both crystalline IGZO (136) layers.

In some embodiments, the multiple oxide layers MOL have a four-layer structure. For example, as shown in FIG. 1D, the multi-layer oxide MOL includes only four oxide semiconductors layers, namely the second barrier layer BR2, the channel layer CH, the first matching layer MT1 and the first barrier layer BR1, which are sequentially provided on the substrate BS. In order to enable the thin film transistor T to have higher mobility and stability, for example, the crystallization degree and the band gap of the second barrier layer BR2 are all greater than those of the channel layer CH; the channel layer CH has the smallest band gap, the highest carrier concentration, the highest carrier mobility and the lowest crystallization degree; the crystallization degree, the band gap, the carrier mobility and the carrier concentration of the first matching layer MT1 are all between those of the channel layer CH and those of the first barrier layer BR1; the second barrier layer BR2, the channel layer CH and the first matching layer MT1 are of the identical type material, the first barrier layer BR1 and the first matching layer MT1 are of the non-identical type material including the same kinds of metal elements; the second barrier layer BR2, the first matching layer MT1 and the first barrier layer BR1 are all crystalline oxide layers; and the thickness of the first barrier layer BR1 is greater than the thickness of the second barrier layer BR2, the thickness of the channel layer CH and the thickness of the first matching layer MT1. For example, the thicknesses of the second barrier layer BR2 and the channel layer CH are both 50 angstroms to 300 angstroms, the thickness of the first matching layer MT1 is 50 angstroms to 200 angstroms, and the thickness of the first barrier layer BR1 is 300 angstroms to 700 angstroms.

In the case where the multiple oxide layers MOL adopt the four-layer structure as shown in FIG. 1D, for example, the second barrier layer BR2, the channel layer CH and the first matching layer MT1 are all IGZO layers, and the element ratio of the IGZO layer is: In≈35%-50%, Ga≈10%~40%, Zn≈20%~40%, so that the IGZO layer has a higher carrier concentration. It should be noted that the ratio of a certain metal element X (X is In, Ga or Zn) is the number of atoms of X divided by the sum of the number of atoms of In, Ga and Zn. For example, the second barrier layer BR2, the channel layer CH and the first matching layer MT1 are all IGZO (111) layers, IGZO (423) layers, IGZO (432) layers, IGZO (312) layers, IGZO (513) layers, IGZO (534) layers, IGZO (713) layers, IGZO (624) layers or IGZO (514) layers. In other embodiments, the second barrier layer BR2, the channel layer CH and the first matching layer MT1 are all IGZYO (Y represents Sn) layers, IGTO layers, ITZO layers, IZO layers, ITO layers or the like.

In the case where the multiple oxide layers MOL adopt the four-layer structure as shown in FIG. 1D, for example, the first barrier layer BR1 is a metal oxide semiconductor layer including two or more of metal elements In, Ga, Zn, and Sn. For example, the first barrier layer is an IGZO layer (indium gallium zinc oxide layer), and the element ratio of the IGZO layer is: In≈7%-14%, Ga≈20%-40%, Zn≈50%-70%. It should be noted that the ratio of a certain metal element X (X is In, Ga or Zn) is the number of atoms of X divided by the sum of the number of atoms of In, Ga and Zn. For example, the first barrier layer BR1 is an IGZO (136) layer, an IGZO (132) layer, an IGZO (243) layer, and an IGZO (153) layer. In other embodiments, the first barrier layer BR1 is an IGO layer, an ITZO layer or the like.

In consideration of the interaction between the four layers of oxides as shown in FIG. 1D and the property of the material of each layer, for example, in the embodiment shown in FIG. 1D, the channel layer CH is an amorphous IGZO (423) layer or a crystalline IGZO (423) layer, the second barrier layer BR2 and the first matching layer MT1 are both crystalline IGZO (423) layers, and the first barrier layer BR1 is a crystalline IGZO (136) layer.

In some embodiments, the multiple oxide layers MOL have a five-layer structure. For example, as shown in FIG. 1E, the multi-layer oxide MOL includes only five oxide semiconductor layers, namely the second barrier layer BR2, the second matching layer MT2, the channel layer CH, the first matching layer MT1 and the first barrier layer BR1, which are sequentially provided on the substrate BS. In order to enable the thin film transistor have higher mobility and stability, for example, the channel layer CH has the smallest band gap, the largest carrier concentration, the highest carrier mobility and the lowest crystallization degree; the crystallization degree, the band gap, the carrier mobility and the carrier concentration of the second matching layer MT2 are all between those of the channel layer CH and those of the second barrier layer BR2; the crystallization degree, the band gap, the carrier mobility and the carrier concentration of the first matching layer MT1 are all between those of the channel layer CH and those of the first barrier layer BR1; the second matching layer MT2, the channel layer CH and the first matching layer MT1 are of the identical type material; the second barrier layer BR2, the second matching layer MT2, the first matching layer MT1 and the first barrier layer BR1 are all crystalline oxide layers; the second barrier layer BR2 and the second matching layer MT2 are non-identical type materials including the same kinds of metal elements (for example, both are IGZO); the first matching layer MT1 and the first barrier layer BR1 are non-identical type materials including the same kinds of metal elements (for example, both are IGZO); and the thicknesses of the second barrier layer BR2 and the first barrier layer BR1 are both greater than the thickness of the second matching layer MT2, the thickness of the channel layer CH and the thickness of first matching layer MT1. For example, the thicknesses of the second matching layer MT2 and the channel layer CH are both 50 angstroms to 300 angstroms, the thickness of the first matching layer MT1 is 50 angstroms to 200 angstroms, and the thicknesses of the second barrier layer BR2 and the first barrier layer BR1 are both 300 angstroms to 700 angstroms.

In the case where the multiple oxide layers MOL adopt the five-layer structure as shown in FIG. 1E, for example, the second matching layer MT2, the channel layer CH and the first matching layer MT1 are all IGZO layers, and the element ratio of the IGZO layer is: In≈35%-50%, Ga≈10%~40%, Zn≈20%~40%, so that the IGZO layer has a higher carrier concentration. It should be noted that the ratio of a certain metal element X (X is In, Ga or Zn) is the number of atoms of X divided by the sum of the number of atoms of In, Ga and Zn. For example, the second matching layer MT2, the channel layer CH and the first matching layer MT1 are all IGZO (111) layers, IGZO (423) layers, IGZO (432) layers, IGZO (312) layers, IGZO (513) layers, IGZO (534) layers, IGZO (713) layers, IGZO (624) layers or IGZO (514) layers. In other embodiments, the second matching layer MT2, the channel layer CH, and the first matching layer MT1 are all IGZYO (Y represents Sn) layers, IGTO layers, ITZO layers, IZO layers, ITO layers, or the like.

In the case where the multiple oxide layers MOL adopt the five-layer structure as shown in FIG. 1E, for example, both the first barrier layer BR1 and the second barrier layer BR2 are metal oxide semiconductor layers including two or more of metal elements In, Ga, Zn, and Sn. For example, the first barrier layer BR1 and the second barrier layer BR2 are both IGZO layers (indium gallium zinc oxide layers), and the element ratio of the IGZO layer is: In≈7%-14%, Ga≈20%-40%, Zn≈50%~70%. It should be noted that the ratio of a certain metal element X (X is In, Ga or Zn) is the number of atoms of X divided by the sum of the number of atoms of In, Ga and Zn. For example, the first barrier layer BR1 and the second barrier layer BR2 are both IGZO (136) layers, IGZO (132) layers, IGZO (243) layers, and IGZO (153) layers. In other embodiments, the first barrier layer BR1 and the second barrier layer BR2 are both IGO layers or ITZO layers.

In consideration of the interaction between the five layers of oxides as shown in FIG. 1E and the property of the material of each layer, for example, in the embodiment shown in FIG. 1E, the channel layer CH is an amorphous IGZO (423) layer or crystalline IGZO (423) layer, the second matching layer MT2 and the first matching layer MT1 are both crystalline IGZO (423) layers, the second barrier layer BR2 and the first barrier layer BR1 are both crystalline IGZO (136) layers.

In any one of the above embodiments, for example, the multiple oxide layers MOL have a slope angle ranged from 25° to 75°, such as, from 25° to 65°. As an example, the slope angle is 45° or approximately 45°, such as 40°~50°. The slope angle of the multiple oxide layers MOL is an angle between an inclined side surface of the multiple oxide layers MOL and the substrate BS. As described above, this can avoid disconnection of the source electrode SE and the drain electrode DE, avoid the occurrence of undercutting the multiple oxide layers MOL and increase the stability of the thin film transistor.

Figure 2A:
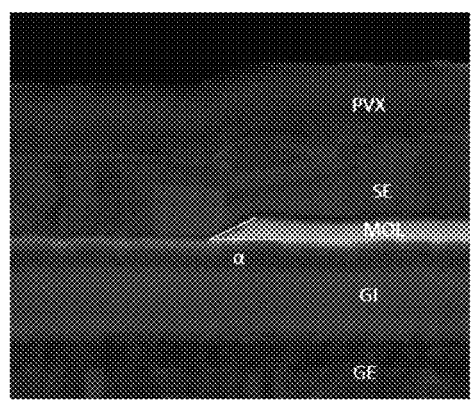
FIG. 2A and FIG. 2B are SEM images of multiple oxide layers in the thin film transistor shown in FIG. 1D.
Figure 2B:
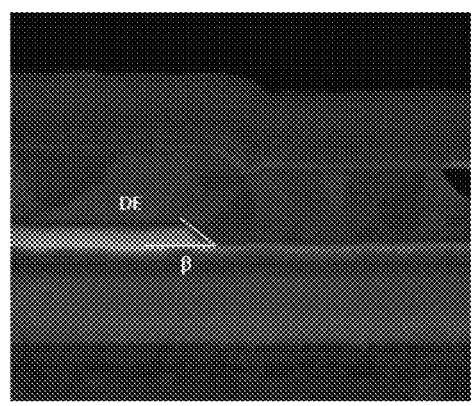

FIG. 2A and FIG. 2B are SEM (scanning electron microscope) images of the multiple oxide layers MOL in the thin film transistor T shown in FIG. 1D. In FIG. 2A, the slope angle of the multiple oxide layers MOL on a side where the source electrode SE is provided is α; in FIG. 2B, the slope angle of the multiple oxide layers MOL on the side where the drain electrode DE is provided is β; it can be seen from FIG. 2A and FIG. 2B that both α and β are approximately 45°. In consideration of the etching fluctuation, the range of α and β is for example ±20°, such as ±10°, and such as ±5°.

Figure 3A:
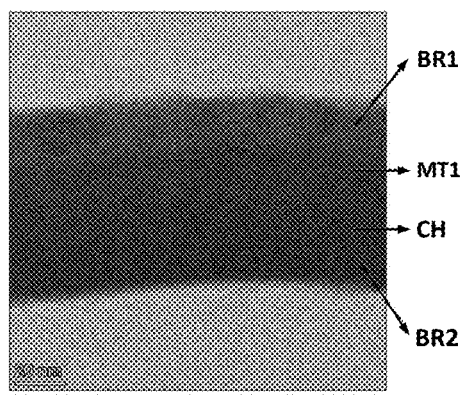
FIG. 3A is a TEM image of the multiple oxide layers in the thin film transistor shown in FIG. 1D.
Figure 3B:
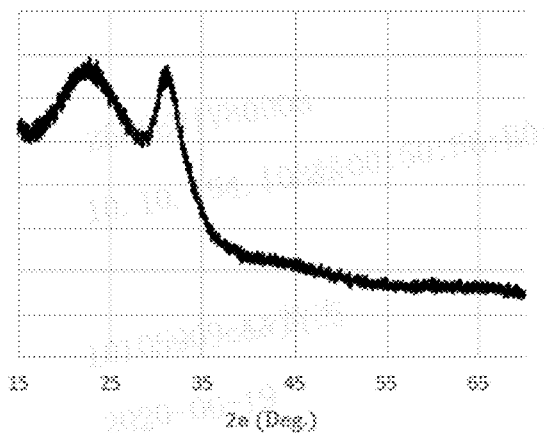
FIG. 3B is an XRD pattern in a case that a channel layer in the thin film transistor shown in FIG. 1D is a crystalline IGZO (423) layer.
Figure 3C:
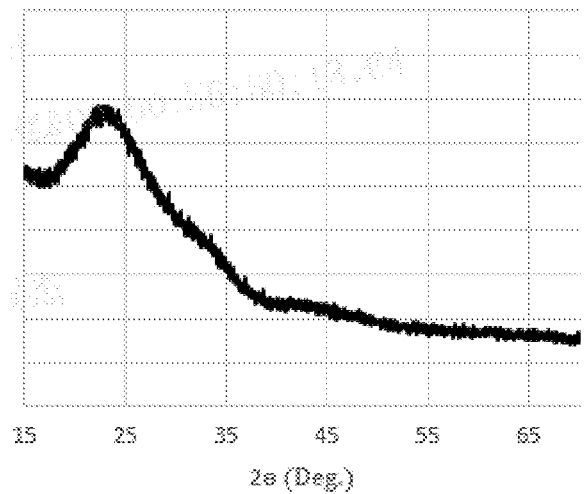
FIG. 3C is an XRD pattern in a case that the channel layer of the thin film transistor shown in FIG. 1D is an amorphous IGZO (423) layer.
Figure 3D:
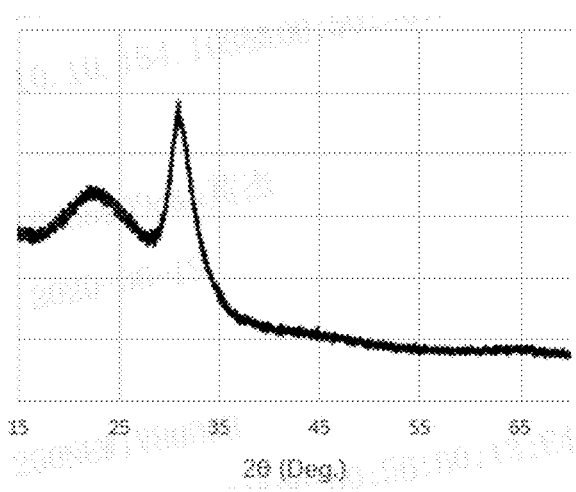
FIG. 3D is an XRD pattern in a case that each of a second barrier layer and a first matching layer in the thin film transistor shown in FIG. 1D is a crystalline IGZO (423) layer.
Figure 3E:
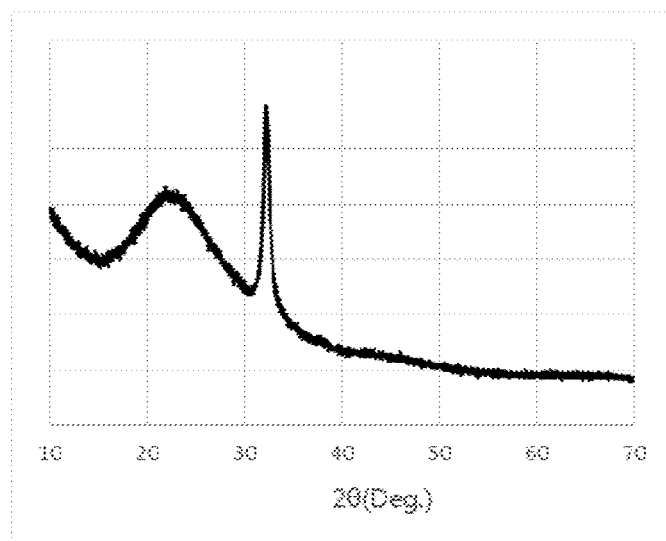
FIG. 3E is an XRD pattern in a case that the first barrier layer in the thin film transistor shown in FIG. 1D is a crystalline IGZO (136) layer.

FIG. 3A is a TEM image of the multiple oxide layers MOL in the thin film transistor T shown in FIG. 1D; FIG. 3B is an XRD pattern in a case that the channel layer CH in the thin film transistor T shown in FIG. 1D is the crystalline IGZO (423) layer; FIG. 3C is an XRD pattern in a case that the channel layer CH in the thin film transistor T shown in FIG. 1D is the amorphous IGZO (423) layer; FIG. 3D is an XRD pattern in a case that the second barrier layer BR2 and the matching layer MT1 in the thin film transistor T shown in FIG. 1D are the crystalline IGZO (423) layers; FIG. 3E is an XRD pattern in a case that the first barrier layer BR1 in the thin film transistor T shown in FIG. 1D is the crystalline IGZO (136) layer.

As shown in FIG. 3A, the multiple oxide layers has the four-layer structure, and includes the second barrier layer BR2, the channel layer CH, the first matching layer MT1 and the first barrier layer BR1 from bottom to top. It can be seen from FIG. 3B and FIG. 3D that the IGZO layer includes a small amount of amorphous regions, but the whole is mainly crystalline, so the XRD pattern shows a crystalline diffraction peak. For example, the second barrier layer BR2 (FIG. 3D), the channel layer CH (FIG. 3B) and the first matching layer MT1 (FIG. 3D) show a significant crystalline diffraction peak at the position of 31°; the peak at the position of approximately 23° is the impurity peak of the substrate, which indicates that the materials of the second barrier layer BR2, the channel layer CH and the first matching layer MT1 exhibit crystalline characteristics. It can be seen from FIG. 3C that the channel layer CH has no crystalline peak in the range of 25° to 35° at the diffraction angle 2 Deg., so the channel layer is an amorphous layer. It can be seen from FIG. 3E that the crystalline peak of the first barrier layer BR1 is at a position of approximately 32°. The crystalline properties of the material may be further determined from the intensity, half-peak width and integrated intensity of the crystalline peak; and it can be seen from FIG. 3A to FIG. 3E that the channel layer has the lowest crystallinity or is in an amorphous state, and the crystal peak of the first barrier layer BR1 has high intensity, narrow half-peak width, and excellent crystalline characteristics.

It should be noted that in the case where the XRD analysis is used to investigate the crystalline state of each oxide layer in the multiple oxide layers MOL, it is necessary to deposit each oxide layer on a glass substrate separately for XRD test; in addition, in order to exclude the influence of the film thickness on the result of the XRD test, the XRD patterns of oxide layers shown in FIG. 3B to FIG. 3E are the results of the XRD test under the condition that the film thickness of the oxide layer is 400 angstroms.

Figures 4A, 4B:
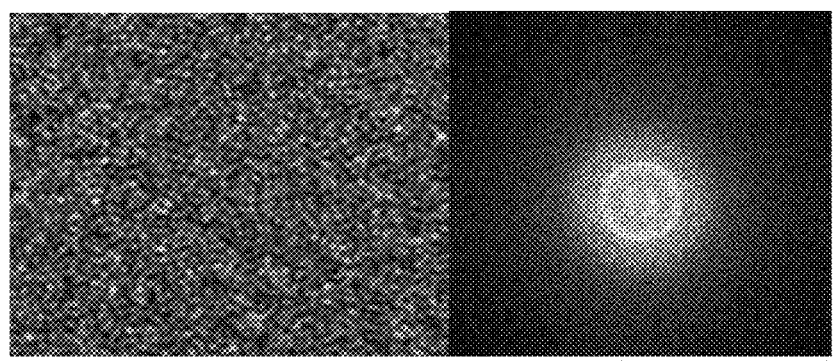
FIG. 4A and FIG. 4B are respectively a TEM image and a FFT transformed diffraction pattern in a case that the channel layer of the thin film transistor shown in FIG. 1D is the amorphous IGZO (423) layer.

FIG. 4A and FIG. 4B are respectively a TEM image and a FFT transformed diffraction pattern in a case that the channel layer CH in the thin film transistor T shown in FIG. 1D is an amorphous IGZO (423) layer; FIG. 4C and FIG. 4D are respectively a TEM image and a FFT transformed diffraction pattern in a case that the channel layer CH in the thin film transistor T shown in FIG. 1D is a crystalline IGZO (423) layer; FIG. 4E and FIG. 4F are respectively TEM image and a diffraction pattern in a case that the first matching layer MT1 in the thin film transistor T shown in FIG. 1D is a crystalline IGZO (423) layer; FIG. 4G and FIG. 4H are respectively a TEM image and an FFT transformed diffraction pattern in a case that the first barrier layer BR1 in the thin film transistor T shown in FIG. 1D is a crystalline IGZO (136) layer.

Referring to FIG. 4A, no obvious crystallization is observed in the TEM image of the IGZO layer; referring to FIG. 4B, there is only one diffuse central spot, that is, amorphous halo, in the FFT transformed diffraction pattern of TEM image of IGZO layer, which proves that the IGZO layer is an amorphous layer.

Referring to FIG. 4C, an obvious crystallization is observed in the TEM image of the IGZO layer; referring to FIG. 4D, a lattice pattern appears in the FFT transformed diffraction pattern of the TEM image of the IGZO layer, which demonstrates that the IGZO layer is a crystalline phase layer.

Referring to FIG. 4E, an obvious crystallization is observed in the TEM image of the IGZO layer; referring to FIG. 4F, a lattice pattern appears in the diffraction pattern of the IGZO layer, which demonstrates that the IGZO layer is a crystalline phase layer.

Referring to FIG. 4G, an obvious crystallization is observed in the TEM image of the IGZO layer; referring to FIG. 4H, a lattice pattern appears in the FFT transformed diffraction pattern of the TEM image of the IGZO layer, which demonstrates that the IGZO layer is a crystalline phase layer.

Figure 5:
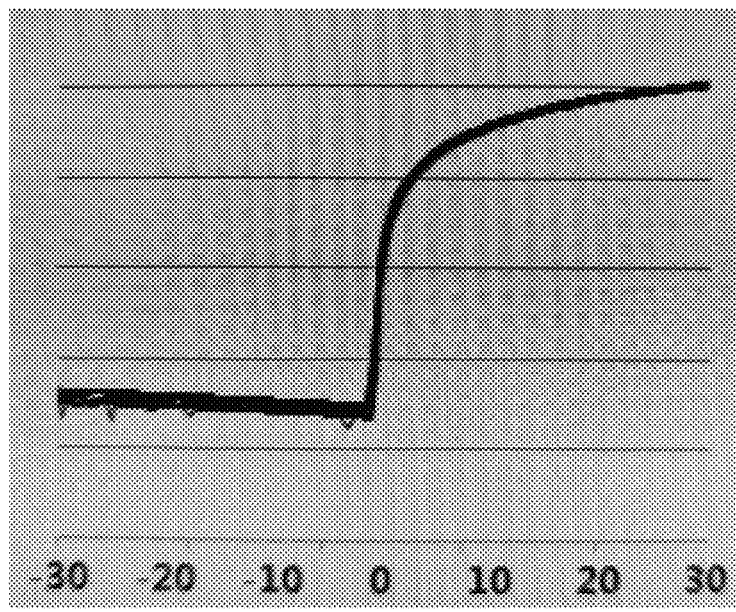
FIG. 5 is an I-V test result graph of the thin film transistor shown in FIG. 1D.

FIG. 5 is an I-V test result diagram of the thin film transistor T shown in FIG. 1D. In FIG. 5, the horizontal ordinate represents a voltage Vg of the gate electrode, and the vertical ordinate represents a current Id of the drain electrode. It can be seen from FIG. 5 that all the position characteristic curves basically overlap, so the thin film transistor T has good uniformity.

Figure 6:
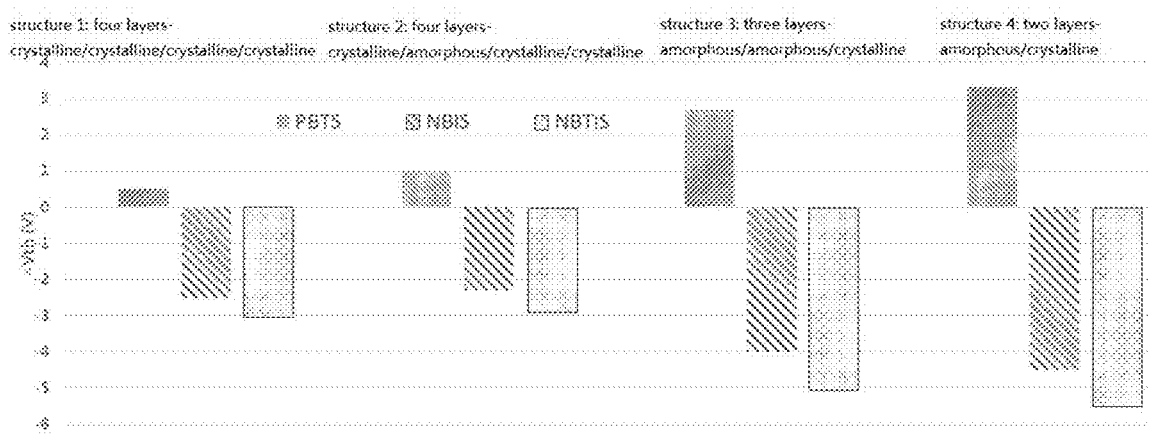
FIG. 6 is a comparison diagram of the stability of the thin film transistors having different structures provided by the embodiments of the present disclosure.

FIG. 6 is a comparison diagram of the stability of the thin film transistor having different structure provided by the embodiments of the present disclosure. The horizontal ordinate in FIG. 6 represents different types of stability corresponding to the four structures, and the vertical ordinate represents the shift of the turn-on voltage (Vth) during the stress test of the thin film transistor. In FIG. 6, PBTS represents simulated long-time temperature tolerance, NBIS represents simulated long-time photo-stability, and NBTIS represents simulated temperature light-illumination stability. In FIG. 6, structure 1 represents that the thin film transistor adopts the four-layer structure as shown in FIG. 1D, in which the second barrier layer BR2, the channel layer CH, the first matching layer MT1 and the first barrier layer BR1 are all crystalline oxides layer. Structure 2 represents that the thin film transistor adopts the four-layer structure as shown in FIG. 1D, in which the channel layer CH is an amorphous oxide layer and all of the second barrier layer BR2, the first matching layer MT1 and the first barrier layer BR1 are crystalline oxide layers. Structure 3 and structure 4 are both comparative examples. Structure 3 represents that the thin film transistor adopts the three-layer structure as shown in FIG. 1C, in which the channel layer CH and the first matching layer MT1 are both amorphous oxides layers, and the first barrier layer BR1 is a crystalline oxide layer. Structure 4 represents that the thin film transistor adopts the two-layer structure as shown in FIG. 1B, in which the channel layer CH is an amorphous oxide layer, and the first barrier layer BR1 is a crystalline oxide layer. It can be seen from FIG. 6 that the stability of the thin-film transistor which adopts the four-layer structure (structure 1 and structure 2) is better than the stability of the thin-film transistor which adopts the three-layer structure (structure 3) or the two-layer structure (structure 4). It can be seen from structure 1 and structure 2 that in the case where the channel layer CH is the amorphous oxide layer, the NBIS and NBTIS characteristics of the thin film transistor are better. Due to the different characteristic requirements of different products on the thin film transistors in practical applications, the amorphous channel layer and the crystalline channel layer in the embodiments of the present disclosure may be applied to different products respectively.

In some embodiments, the multiple oxide layers MOL are formed by a photolithography process using one single mask, the photolithography process includes the following steps: sequentially forming multiple oxide films on the substrate BS; and then coating a photoresist on the multiple oxide films; next, exposing the photoresist by using a mask and developing the exposed photoresist to obtain a photoresist pattern; after that, performing an etching process (for example, wet etching) on the multiple oxide films by using the photoresist pattern to obtain the multiple oxide layers MOL. Because the multiple oxide layers MOL are fabricated by using one single mask, edges of the surfaces of adjacent layers which are in direct contact in the multiple oxide layers MOL are substantially aligned with each other, and the upper oxide layer exposes a side surface of the lower oxide layer which is in direct contact with the upper oxide layer. In the embodiments of the present disclosure, "substantially" refers to ignoring the influence caused by deviations of manufacturing process.

In some embodiments, as shown in FIG. 1B to FIG. 1F, in the case where the first barrier layer BR1 is provided on the side of the channel layer CH facing away from the substrate BS, the wettability of the first barrier layer BR1 to the photoresist is greater than that of the layer adjacent to the first barrier layer BR1 in the multiple oxide layers MOL to the photoresist. Taking the photoresist as a positive photoresist as an example, the contact angle between the first barrier layer BR1 and the positive photoresist is larger than the contact angle between the first matching layer MT1 (as shown in FIG. 1C to FIG. 1E) or the channel layer CH (as shown in FIG. 1B and FIG. 1F) and the positive photoresist, in this situation, the wettability of the first barrier layer BR1 to the positive photoresist is greater than the wettability of the first matching layer MT1 (as shown in FIG. 1C to FIG. 1E) or the wettability of the channel layer CH (as shown in FIG. 1B and FIG. 1F) to the positive photoresist. By enabling the first barrier layer BR1 provided at the outermost side of the multiple oxide layers MOL to have better wettability to the photoresist, better adhesion property is achieved between the first barrier layer BR1 and the photoresist pattern, so as to prevent the photoresist pattern from falling off.

In other embodiments, a sacrificial layer is formed on the multiple oxide layers MOL, so that the sacrificial layer and the photoresist pattern have better adhesion property to prevent the photoresist pattern from falling off, and the sacrificial layer plays a role of protecting the multiple oxide layers MOL.

FIG. 7A to FIG. 7G are schematically structural diagrams of the thin film transistors including a sacrificial layer provided by the embodiments of the present disclosure, in which FIG. 7A to FIG. 7F are schematically structural diagrams of adding the sacrificial layer to the thin film transistor shown in FIG. 1A to FIG. 1F, respectively.

Figure 7A:
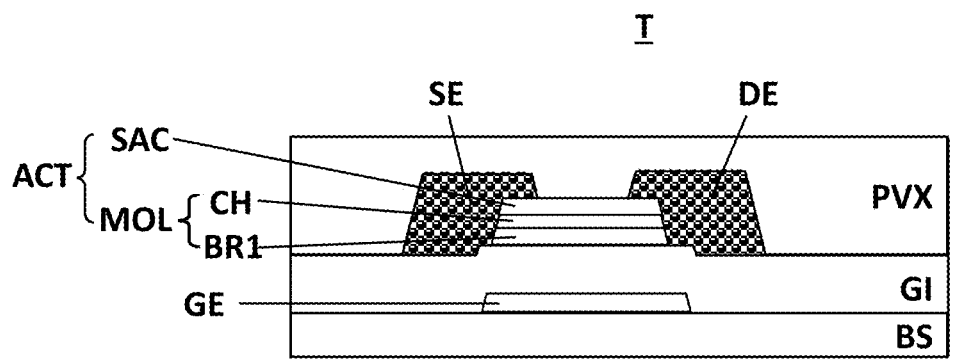
FIG. 7A to FIG. 7G are schematically structural diagrams of the thin film transistors including a sacrificial layer provided by the embodiments of the present disclosure.
Figure 7B:
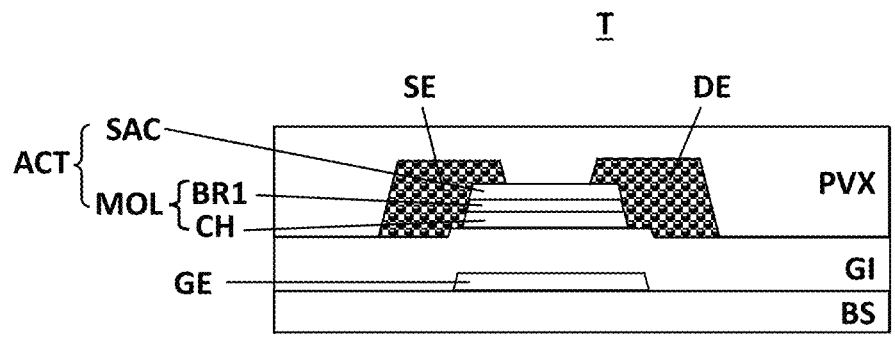
Figure 7C:
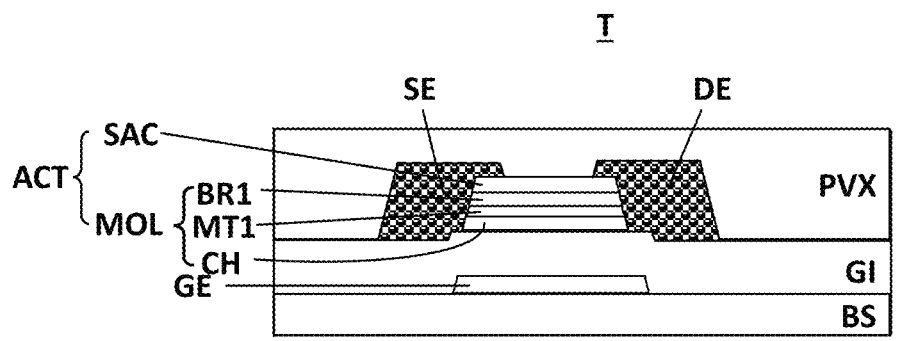
Figure 7D:
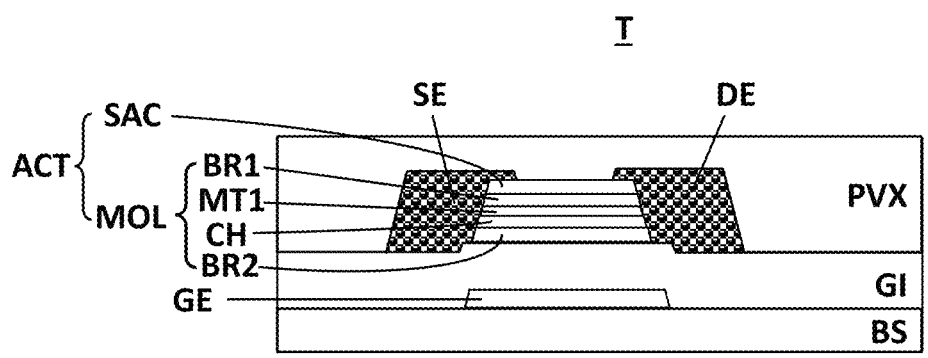
Figure 7E:
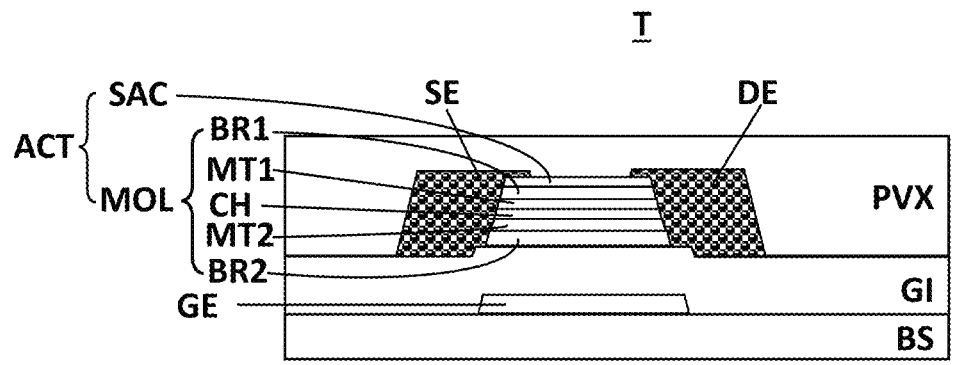
Figure 7F:
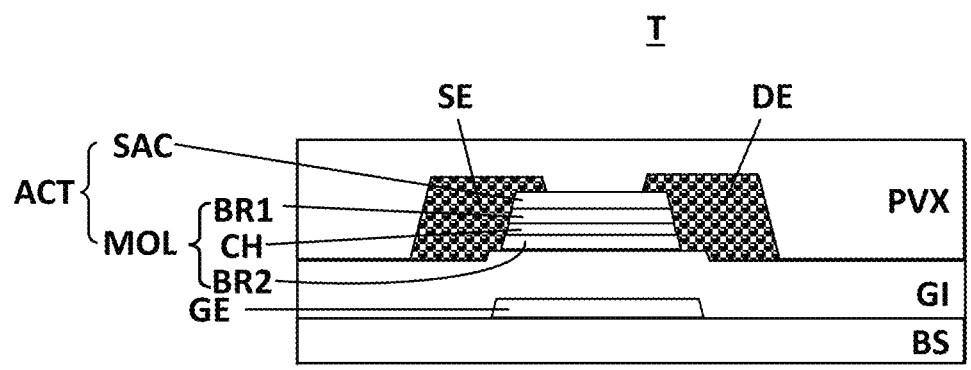

As shown in FIG. 7A to FIG. 7G, the active layer ACT in the thin film transistor T further includes the sacrificial layer SAC stacked with the multiple oxide layers MOL, and the sacrificial layer SAC is provided on a side of the multiple oxide layers MOL facing away from the substrate BS, the wettability of the sacrificial layer SAC to the photoresist is greater than the wettability of the surface of the multiple oxide layers MOL farthest from the substrate BS to the photoresist. Taking the photoresist as a positive photoresist as an example, the contact angle between the sacrificial layer SAC and the positive photoresist is larger than the contact angle between the channel layer CH (as shown in FIG. 7A) or the first barrier layer BR1 (as shown in FIG. 7B to FIG. 7F) and the positive photoresist, in this situation, the wettability of the first barrier layer BR1 to the positive photoresist is greater than that of the channel layer CH (as shown in FIG. 7A) or the first barrier layer BR1 (shown in FIG. 7B to FIG. 7F) to the positive photoresist.

In some embodiments, as shown in FIG. 7A to FIG. 7G, the thin film transistor T includes the source electrode SE and the drain electrode DE provided on the side of the multiple oxide layers MOL facing away from the substrate BS, and the sacrificial layer SAC is provided between the layer where the source electrodes SE and the drain electrodes DE are provided and the multiple oxide layers MOL in a direction perpendicular to the substrate BS. In this situation, during the process of etching the material for forming the source electrode SE and the drain electrode DE, the sacrificial layer SAC plays a role of protecting the multiple oxide layers MOL.

Figure 7G:
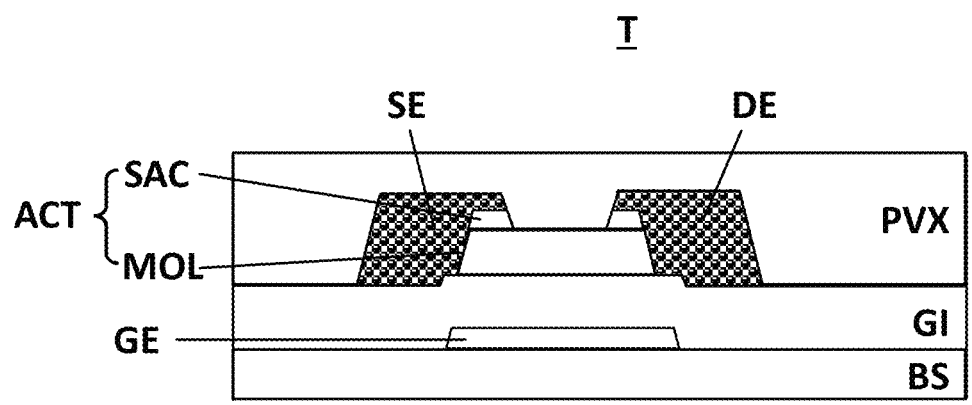

During the process of etching the material for forming the source electrode SE and the drain electrode DE, it is possible that the sacrificial layer SAC is broken because the sacrificial layer SAC is corroded by the etchant. For example, as shown in FIG. 7G, the sacrificial layer SAC is disconnected between the source electrode SE and the drain electrode DE.

In some embodiments, the sacrificial layer SAC and the multiple oxide layers MOL are formed by a photolithography process using one single mask, which can reduce the manufacture cost. For example, the photolithography process includes the following steps: sequentially forming multiple oxide films and a sacrificial film on the substrate BS; and then coating a photoresist on the sacrificial film; next, exposing the photoresist by using a mask and developing the exposed photoresist to obtain a photoresist pattern; after that, performing an etching process (for example, wet etching) by using the photoresist pattern to obtain the multiple oxide layers MOL and the sacrificial layer SAC. Because the multiple oxide layers MOL and the sacrificial layer SAC are fabricated by using the one single mask, an outer edge of the sacrificial layer SAC is substantially aligned with an edge of the surface of the multiple oxide layers MOL in direct contact with the sacrificial layer SAC, and the sacrificial layer SAC exposes a side surface of the multiple oxide layers MOL as shown in FIG. 7A to FIG. 7G. In the embodiments of the present disclosure, "substantially" refers to ignoring the influence caused by deviations of manufacturing process.

In some embodiments, the sacrificial layer SAC and the multiple oxide layers MOL are formed by multiple etchings. For example, during the multiple etchings, the sacrificial film is first etched by using the photoresist pattern to obtain the sacrificial layer SAC, and then the multiple oxide films are etched by using the sacrificial layer SAC as a mask to obtain the multiple oxide layers MOL.

In other embodiments, the sacrificial layer SAC and the multiple oxide layers MOL are formed by the one single etching. For example, during the etching process, the sacrificial film and the multiple oxide films are etched together by using the photoresist pattern as a mask (i.e., the one single etching) to obtain the sacrificial layer SAC and the multiple oxide layers MOL, respectively.

The inventors of the present disclosure notice in research that in the case where the sacrificial layer SAC and the multiple oxide layers MOL are formed in the manner of the above-mentioned multiple etchings, it is possible that the multiple oxide layers MOL are drilled. In view of this, for example, the sacrificial layer SAC and the multiple oxide layers MOL are formed in the manner of the above-mentioned single etching.

In order to enable the sacrificial layer SAC and the multiple oxide layers MOL to be formed by the one single etching, in some embodiments, the sacrificial layer SAC is selected from the group consisting of a metal oxide layer and a metal sulfide layer.

Because the sacrificial layer SAC is provided between the multiple oxide layers MOL and the source electrode SE as well as the drain electrode DE, in order to prevent the sacrificial layer SAC from affecting the electrical connection between the multiple oxide layers MOL and the source electrode SE as well as the drain electrode DE, in some embodiments, the sacrificial layer SAC is made from a semiconductor material. For example, the sacrificial layer SAC is selected from the group consisting of a metal oxide semiconductor layer and a metal sulfide semiconductor layer.

In order to further prevent the sacrificial layer SAC from the affecting the electrical connection between the multiple oxide layers MOL and the source electrode SE as well as the drain electrode DE, the thickness of the sacrificial layer SAC should not be too thick, for example, the thickness of the sacrificial layer SAC is equal to or less than 100 angstroms. In some embodiments, the thickness of the sacrificial layer SAC is 50 angstroms to 100 angstroms.

At least one embodiment of the present disclosure further provides an array substrate, and the array substrate includes the thin film transistor T provided by any one of the above embodiments.

Figure 8:
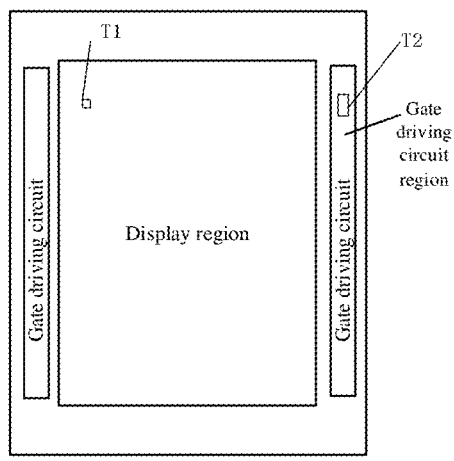
FIG. 8 is a simplified top view of an array substrate provided by the embodiments of the present disclosure.

FIG. 8 is a simplified top view of an array substrate provided by the embodiments of the present disclosure. As shown in FIG. 8, the array substrate provided by at least one embodiment of the present disclosure includes a display region and a gate driving circuit region provided on a periphery of the display region, and the gate driving circuit region is provided with a gate driving circuit; the array substrate includes a plurality of thin film transistors T provided by any one of the embodiments, the plurality of thin film transistors T include a first thin film transistor T1 (as an example, only one T1 is shown in FIG. 8 for illustration) provided in the display region and a second thin film transistor T2 (as an example, only one T2 is shown in FIG. 8 for illustration) provided in the gate driving circuit region. The width-to-length ratio of the second thin film transistor T2 is 12-150 times that of the first thin film transistor T1. The thin film transistor T provided by the embodiments of the present disclosure can meet the requirements of display and gate driving circuits at the same time.

In some embodiments, the width-to-length ratio of the first thin film transistor T1 is 0.5~2. For example, the width-to-length ratio of the first thin film transistor T1 is 4 μm/5 μm, 5 μm/5 μm, or 10 μm/10 μm.

In some embodiments, the width-to-length ratio of the second thin film transistor T2 is 12.5~118. For example, the width-to-length ratio of the second thin film transistor T2 is from 10 μm/8.5 μm to 1000 μm/8.5 μm, for example, from 10 μm/8.5 μm to 200 μm/8.5 μm.

In some embodiments, the width of the second thin film transistor T2 is 1-500 times the width of the first thin film transistor T1, and the length of the second thin film transistor T2 is 1.5-2 times the length of the first thin film transistor T1.

Figure 9A:
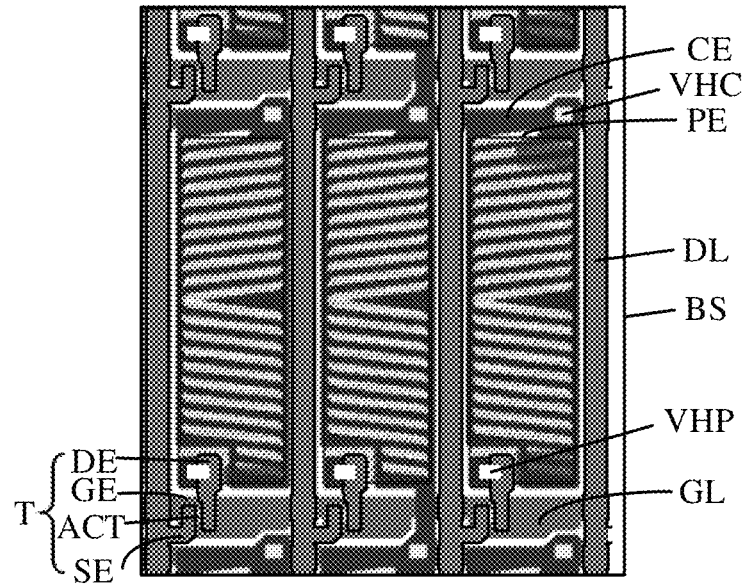
FIG. 9A is a schematic top view of a plurality of sub-pixel regions in the array substrate provided by the embodiments of the present disclosure.
Figure 9B:
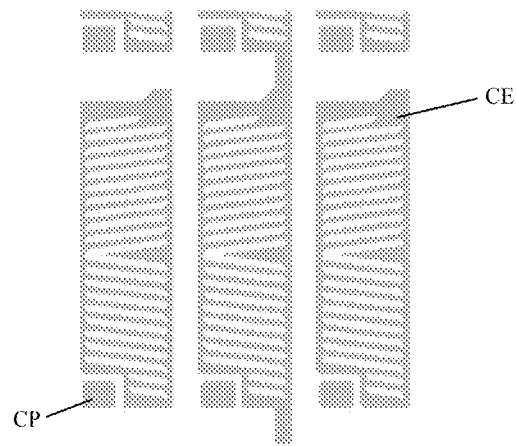
FIG. 9B is a schematic top view of a common electrode layer in FIG. 9A.
Figure 9C:
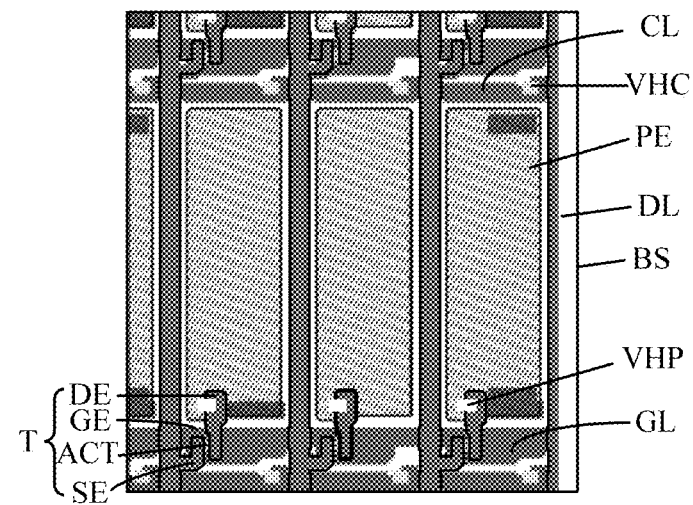
FIG. 9C is a schematic top view after removing the common electrode layer in FIG. 9A.
Figure 9D:
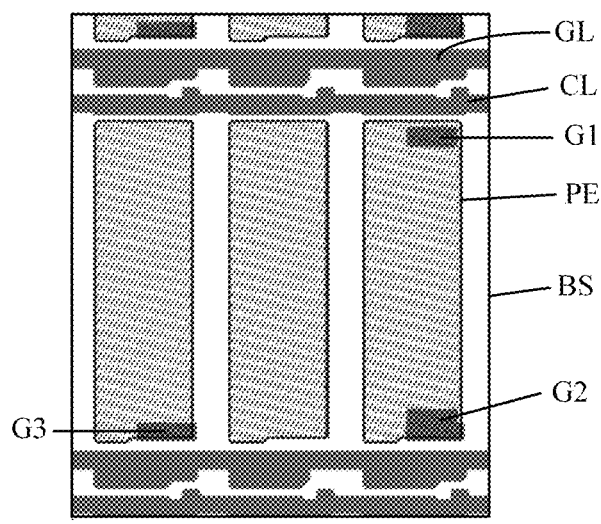
FIG. 9D is a schematic top view of a gate metal layer and a pixel electrode in FIG. 9A.

FIG. 9A is a schematic top view of a plurality of sub-pixel regions in the array substrate provided by the embodiments of the present disclosure; FIG. 9B is a schematic top view of a common electrode layer in FIG. 9A; FIG. 9C is a schematic top view after removing the common electrode layer in FIG. 9A; FIG. 9D is a schematic top view of a gate metal layer and a pixel electrode in FIG. 9A.

As shown in FIG. 9A, the array substrate includes a plurality of gate lines GL and a plurality of data lines DL on the substrate BS, and the plurality of gate lines GL intersect with the plurality of data lines DL. For example, the width of a portion of the gate line GL at a position of the gate line GL intersecting with the data line DL is smaller than the width of a portion of the gate line GL provided between adjacent data lines DL, which can reduce the parasitic capacitance between the gate line GL and the data line DL. For example, the width of a portion of the data line DL at a position of the data line DL intersecting with the gate line GL (the width is the dimension in the extension direction of the gate line GL) is larger than the width of a portion of the data line DL provided between adjacent gate lines GL; by enabling the data line DL at the position of the data line DL intersecting with the gate line GL to have larger width, it is beneficial to prevent the data line DL from being broken due to a step difference at the position of the data line DL intersecting with the gate line GL.

As shown in FIG. 9A and FIG. 9C, the region defined by the intersection of adjacent gate lines GL and adjacent data lines DL is the sub-pixel region. Each sub-pixel region is provided with a pixel electrode PE and a thin film transistor T electrically connected to the pixel electrode PE. The thin film transistor T includes a gate electrode GE, an active layer ACT, a source electrode SE and a drain electrode DE, and the drain electrode DE is electrically connected to the pixel electrode PE. For example, the drain electrode DE is electrically connected to the pixel electrode PE through a via hole VHP. In at least one embodiment, the gate electrode GE is a part of the gate line GL, and the source electrode SE is a part of the data line DL, which can save the manufacturing process. In at least one embodiment, the source electrode SE includes a first extension portion extending along the gate line GL and a second extension portion extending along the data line DL. In at least one embodiment, the drain electrode DE extends along the data line DL, and the drain electrode DE includes a first portion overlapping with the gate line GL and a second portion overlapping with the pixel electrode PE; the dimension of the first portion in the extension direction of the gate line GL is smaller than the dimension of the second portion in the extension direction of the gate line GL. By enabling the portion of the drain electrode DE electrically connected to the pixel electrode PE to have larger dimension, it is beneficial to ensure the electrical connection between the drain electrode DE and the pixel electrode PE.

As shown in FIG. 9A, the array substrate further includes a common electrode CE on the substrate BS. In some embodiments, the pixel electrode PE is provided between the common electrode CE and the substrate BS; the pixel electrode PE is a plate-like structure without slits, the common electrode CE includes a plurality of electrode strips, and the extension directions of the plurality of the electrode strips included in the common electrode CE may be the same or different. For example, as shown in FIG. 9A, the plurality of electrode strips included in the common electrode CE include a plurality of first electrode strips which are substantially parallel to each other and a plurality of second electrode strips which are substantially parallel to each other, and the extension direction of the second electrode strips intersect with the extension direction of the first electrode strips, so as to form a double-domain structure. In other embodiments, the common electrode CE is provided between the pixel electrode PE and the substrate BS; the common electrode CE is a plate-like structure without slits, the pixel electrode PE includes a plurality of electrode strips, and the extension directions of the plurality of electrode strips included in the pixel electrode PE may be the same or different. In other embodiments, both the common electrode CE and the pixel electrode PE include a plurality of electrode strips.

For example, as shown in FIG. 9A and FIG. 9B, the common electrode CE includes a plurality of sub-common electrodes, each sub-common electrode is provided in the sub-pixel region; the sub-common electrodes provided in the sub-pixel regions of the same column are, for example, directly connected with each other, and the sub-common electrodes provided in the sub-pixels of the same row are electrically connected with each other for example through a same common electrode signal line CL (as shown in FIG. 9D); for example, the common electrode signal line CL is electrically connected with the corresponding sub-common electrode through a via hole VHC. In at least one embodiment, the common electrode signal line CL and the gate line GL are disposed in a same layer, that is, the common electrode signal line CL and the gate line GL are both provided in a gate metal layer, thus the manufacturing process is simplified. In at least one embodiment, the common electrode signal line CL has a protrusion at the position of the via hole VHC to ensure the electrical connection between the common electrode signal line CL and the sub-common electrodes. In at least one embodiment, the sub-common electrode has a protrusion at the position of the via hole VHC to ensure the electrical connection between the common electrode signal line CL and the sub-common electrode.

In some embodiments, the layer where the common electrode is provided (i.e., the common electrode layer) further includes a connection block CP disconnected from the common electrode CE, the connection block CP is provided at the position where the via hole VHP is provided, and the connection block CP is configured to electrically connect the drain electrode DE with the pixel electrodes PE.

In some embodiments, as shown in FIG. 9D, the gate metal layer further includes spacer barrier walls G1, G2 and G3 configured for preventing spacers from sliding into an opening region of the sub-pixel region. For example, the spacer barrier walls G1 and G2 are provided on two opposite sides of the same sub-pixel region in the extension direction of the data line DL, and the sub-pixel region where the spacer barrier wall G3 is provided is different from the sub-pixel region where the spacer barrier walls G1 and G2 are provided.

Figure 10A:
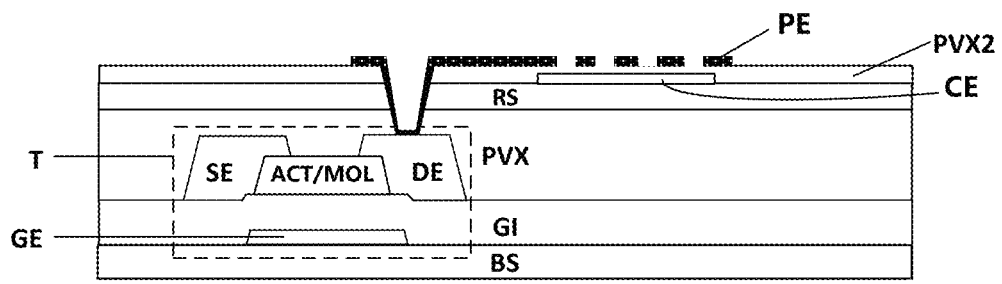
FIG. 10A to 10C are schematic cross-sectional views of the array substrate provided by the embodiments of the present disclosure.
Figure 10B:
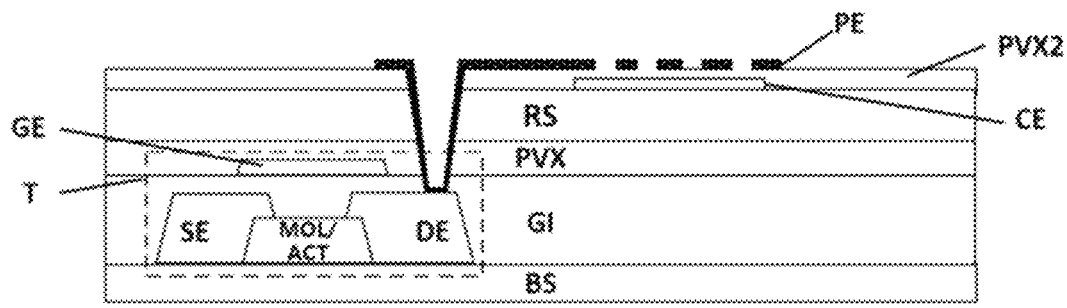
Figure 10C:
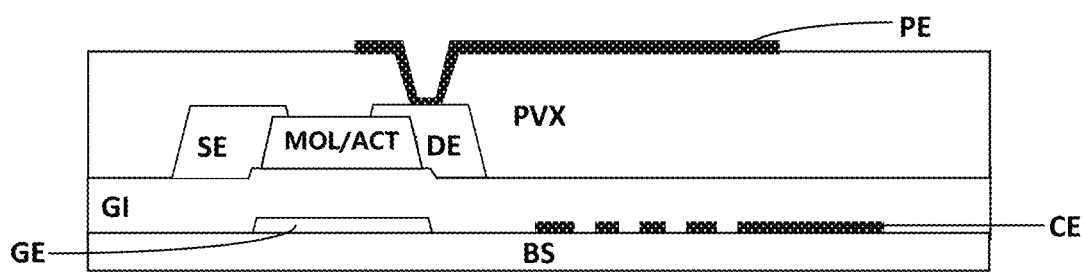

FIG. 10A to FIG. 10C are schematic cross-sectional views of the array substrate provided by the embodiments of the present disclosure.

In at least one embodiment, the thin film transistor T has a bottom-gate structure. For example, as shown in FIG. 10A, the array substrate includes: a gate metal layer (including a gate electrode GE), a first inorganic insulating layer GI, an active layer ACT, a source-drain metal layer (including a source electrode SE and a drain electrode DE), a second inorganic insulating layer PVX, an organic layer RS, a common electrode layer (including a common electrode CE), a third inorganic insulating layer PVX2, and a pixel electrode layer (including a pixel electrode PE), all of which are sequentially provided on the substrate BS.

In at least one embodiment, the thin film transistor T has a top-gate structure. For example, as shown in FIG. 10B, the array substrate includes an active layer ACT, a source-drain metal layer (including a source electrode SE and a drain electrode DE), a first inorganic insulating layer GI, a gate metal layer (including a gate electrode GE), a second inorganic insulating layer PVX, an organic layer RS, a common electrode layer (including a common electrode CE), a third inorganic insulating layer PVX2, and a pixel electrode layer (including the pixel electrode PE), all of which are sequentially provided on the substrate BS.

In at least another embodiment, as shown in FIG. 10C, the array substrate includes a gate metal layer including a gate electrode GE and a common electrode layer including a common electrode CE on the substrate BS. The fabrication order of the gate metal layer and the common electrode layer may be interchanged. The array substrate further includes: a first inorganic insulating layer GI covering the gate electrode GE and the common electrode CE, an active layer ACT, a source-drain metal layer (including a source electrode SE and a drain electrode DE), and a second inorganic insulating layer PVX, and a pixel electrode layer (including the pixel electrode PE), all of which are sequentially provided on the substrate BS.

It should be noted that the positions of the pixel electrode PE and the common electrode CE may be interchanged. In addition, the positions of the gate electrode GE, the active layer ACT and the source-drain metal layer may be adjusted as required. Moreover, the active layer ACT includes only the multiple oxide layers MOL, or includes the multiple oxide layers MOL and the sacrificial layer SAC.

At least one embodiment of the present disclosure provides an electronic device including the thin film transistor T provided by any one of the above embodiments or the array substrate provided by any one of the above embodiments.

For example, the electronic device is a camera device, a light-emitting device, an electro-optical device, a power generation device (including thin-film solar cells, organic thin-film solar cells, etc.), a liquid crystal panel, an electronic paper, an OLED panel, a mobile phone, a tablet computer, a television, a display, a laptop computer, a digital photo frame, a navigator and any other product or component.

At least one embodiment of the present disclosure provides a manufacturing method of a thin film transistor provided by any one of the above embodiments. Taking the thin film transistor T shown in FIG. 1A to FIG. 1F as an example, the manufacturing method includes: forming the active layer ACT on the substrate BS, so that the active layer ACT includes the multiple oxide layers MOL arranged in a stack. The multiple oxide layers MOL are formed by using one single mask; the multiple oxide layers MOL include the channel layer CH and the first barrier layer BR1 provided on the outermost side of the multiple oxide layers MOL, and the channel layer CH is the layer with the highest carrier mobility in the multiple oxide layers MOL; the channel layer CH is an amorphous oxide layer or a crystalline oxide layer, the first barrier layer BR1 is a crystalline oxide layer, and the crystallization degree of the first barrier layer BR1 is greater than that of the channel layer; and the band gap of the first barrier layer BR1 is larger than the band gap of the channel layer CH.

In some embodiments, the multiple oxide layers MOL further include a transition layer, the transition layer is provided on the side of the channel layer CH facing towards the substrate BS or on the side of the channel layer CH facing away from the substrate BS; the transition layer is in direct contact with the channel layer CH; the transition layer is a crystalline oxide layer, the crystallization degree of the transition layer is greater than that of the channel layer CH, and the band gap of the transition layer is larger than that of the channel layer CH. The transition layer at least plays a role in preventing the channel layer CH from directly contacting the first inorganic insulating layer GI or the second inorganic insulating layer PVX.

In some embodiments, as shown in FIG. 1C to FIG. 1E, the transition layer is the first matching layer MT1 included in the multiple oxide layers MOL, which is provided between the channel layer CH and the first barrier layer BR1; the first matching layer MT1 is a crystalline oxide, and the crystallization degree of the first matching layer MT1 is between that of the channel layer CH and that of the first barrier layer BR1. In this situation, the forming the multiple oxide layers MOL includes: forming the first matching layer MT1 and the channel layer CH by using the same targets in the same vacuum chamber.

In some embodiments, in the case where the transition layer is the first matching layer MT1, the forming the multiple oxide layers MOL further includes: forming the second barrier layer BR2 between the channel layer CH and the substrate BS, as shown in FIG. 1D to FIG. 1E. For example, for the thin film transistor T shown in FIG. 1D, the second barrier layer BR2, the channel layer CH and the first matching layer MT1 are successively deposited in the same vacuum chamber by using the same targets material.

In other embodiments, as shown in FIG. 1F, the transition layer is the second barrier layer BR2 provided on the side of the channel layer CH facing towards the substrate BS, and the band gap of the second barrier layer BR2 is larger than that of the channel layer CH, in this situation, the first barrier layer BR1 is provided on the side of the channel layer CH facing away from the substrate BS. In this situation, the forming the multiple oxide layers MOL includes: forming the second barrier layer (the transition layer), the channel layer, and the first barrier layer by using the same targets in the same vacuum chamber.

Figure 11:
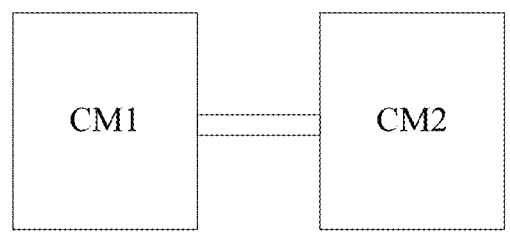
FIG. 11 is a schematic diagram of a first vacuum chamber and a second vacuum chamber adopted in a manufacturing method of a thin film transistor provided by the embodiments of the present disclosure.

In some embodiments, the forming the multiple oxide layers MOL includes: as shown in FIG. 11, after forming the channel layer CH in a first vacuum chamber CM1, moving the substrate BS on which the channel layer CH is formed into a second vacuum chamber CM2; and then, the first barrier layer BR1 is formed in the second vacuum chamber CM2. During the procedure of moving the substrate BS on which the channel layer CH is formed into the second vacuum chamber CM2, the first vacuum chamber CM1 and the second vacuum chamber CM2 communicate with each other (vacuum communication), which can prevent the channel layer CH from contacting with the atmosphere. It should be noted that "vacuum" does not mean the absolute vacuum, but means that the air pressure in the vacuum chamber is lower than the atmospheric pressure outside the vacuum chamber because part of the gas is evacuated.

Taking the multiple oxide layers MOL in the thin film transistor T shown in FIG. 1A as an example, the forming the multiple oxide layers MOL in the manufacturing method provided by the embodiments of the present disclosure includes the following steps SA1 to SA3:

SA1: depositing the first barrier film for forming the first barrier layer in the second vacuum chamber CM2, and then moving the substrate on which the first barrier film is formed into the first vacuum chamber CM1;

SA2: depositing a channel film for forming the channel layer in the first vacuum chamber CM1, thereby forming multiple oxide films which includes the channel film and the first barrier film arranged in a stack on the substrate BS;

SA3: coating a photoresist on the multiple oxide films; exposing the photoresist with one single mask and developing the exposed photoresist to obtain a photoresist pattern; and then, performing an etching process on the multiple oxide films by using the photoresist pattern to obtain the multiple oxide layers MOL.

Taking the multiple oxide layers MOL in the thin film transistor T shown in FIG. 1B as an example, the forming the multiple oxide layers MOL in the manufacturing method provided by the embodiments of the present disclosure includes the following steps SB1 to SB3:

SB1: depositing the channel film in the first vacuum chamber CM1, moving the substrate on which the channel film is formed into the second vacuum chamber CM2;

SB2: depositing a first barrier film in the second vacuum chamber CM2, thereby forming multiple oxide films including the channel film and the first barrier film arranged in a stack on the substrate BS;

SB3: coating a photoresist on the multiple oxide films; exposing the photoresist with one single mask and developing the exposed photoresist to obtain a photoresist pattern; and then, performing an etching process on the multiple oxide films by using the photoresist pattern to obtain the multiple oxide layers MOL.

Taking the multiple oxide layers MOL in the thin film transistor T shown in FIG. 1C as an example, the forming the multiple oxide layers MOL in the manufacturing method provided by the embodiments of the present disclosure includes the following steps SC1 to SC3:

SC1: successively depositing a channel film and a first matching film for forming the first matching layer, which are sequentially arranged in a stack, by using the same targets in the first vacuum chamber CM1, and moving the substrate on which the channel film and the first matching film are formed into the second vacuum chamber CM2;

SC2: depositing a first barrier film in the second vacuum chamber CM2, thereby forming multiple oxide films including the channel film, the first matching film and the first barrier film arranged in a stack on the substrate BS;

SC3: coating a photoresist on the multiple oxide films; exposing the photoresist with one single mask and developing the exposed photoresist to obtain a photoresist pattern; and then, performing an etching process on the multiple oxide films by using the photoresist pattern to obtain the multiple oxide layers MOL.

Taking the multiple oxide layers MOL in the thin film transistor T shown in FIG. 1D as an example, the forming the multiple oxide layers MOL in the manufacturing method provided by the embodiments of the present disclosure includes the following steps SD1 to SD3:

SD1: successively depositing a second barrier film for forming a second barrier layer, a channel film and a first matching film, which are sequentially arranged in a stack, by using the same targets in the first vacuum chamber CM1, and moving the substrate on which the second barrier film, the channel film and the first matching film are formed into the second vacuum chamber CM2;

SD2: then, depositing a first barrier film in the second vacuum chamber CM2, thereby forming multiple oxide films including the second barrier film, the channel film, the first matching film and the first barrier film arranged in a stack on the substrate BS;

SD3: coating a photoresist on the multiple oxide films; exposing the photoresist with one single mask and developing the exposed photoresist to obtain a photoresist pattern; and then, performing an etching process on the multiple oxide films by using the photoresist pattern to obtain the multiple oxide layers MOL.

Taking the multiple oxide layers MOL in the thin film transistor T shown in FIG. 1E as an example, the forming the multiple oxide layers MOL in the manufacturing method provided by the embodiments of the present disclosure includes the following steps SE1 to SE4:

SE1: depositing the second barrier film in the second vacuum chamber CM2, moving the substrate on which the second barrier film is formed into the first vacuum chamber CM1;

SE2: successively depositing the second matching film for forming the second matching layer, the channel film and the first matching film, which are sequentially arranged in a stack, by using the same targets in the first vacuum chamber CM1, and then moving the substrate on which the second matching film, the channel film and the first matching film are formed into the second vacuum chamber CM2;

SE3: depositing a first barrier film in the second vacuum chamber CM2, thereby forming multiple oxide films including the second barrier film, the second matching film, the channel film, the first matching film and the first barrier film arranged in a stack on the substrate BS;

SE4: coating a photoresist on the multiple oxide films; exposing the photoresist with one single mask and developing the exposed photoresist to obtain a photoresist pattern; and then performing an etching process on the multiple oxide films by using the photoresist pattern to obtain the multiple oxide layers MOL.

Taking the multiple oxide layers MOL in the thin film transistor T shown in FIG. 1F as an example, the forming the multiple oxide layers MOL in the manufacturing method provided by the embodiments of the present disclosure includes the following steps SF11 to SF14:

SF11: depositing the second barrier film in the second vacuum chamber CM2, and then moving the substrate on which the second barrier film is formed into the first vacuum chamber CM1;

SF12: depositing the channel film in the first vacuum chamber CM1, and then moving the substrate on which the second barrier film and the channel film are formed into the second vacuum chamber CM2;

SF13: next, depositing a first barrier film in the second vacuum chamber CM2, thereby forming multiple oxide films including the second barrier film, the channel film, the first barrier film arranged in a stack on the substrate BS;

SF14: coating a photoresist on the multiple oxide films; exposing the photoresist with one single mask and developing the exposed photoresist to obtain a photoresist pattern; and then, performing an etching process on the multiple oxide films by using the photoresist pattern to obtain the multiple oxide layers MOL.

In other embodiments, the forming the active layer ACT in the thin film transistor T as shown in FIG. 1F includes the following steps SF21 to SF22:

SF21: successively depositing the second barrier film, the channel film and the first barrier film, which are sequentially arranged in a stack, by using the same targets in the same vacuum chamber, thereby forming multiple oxide films including the second barrier film, the channel film and the first barrier film arranged in a stack on the substrate BS;

SF22: coating a photoresist on the multiple oxide films; exposing the photoresist with one single mask and developing the exposed photoresist to obtain a photoresist pattern; and then, performing an etching process on the multiple oxide films by using the photoresist pattern to obtain the multiple oxide layers MOL.

In any one of the above embodiments, for example, the multiple oxide films are etched by the same single etching.

For example, in any one of the above embodiments, the deposition method is physical vapor deposition, and oxide semiconductor layers with different crystallinities and different band gaps may be obtained by controlling the deposition conditions.

In any one of the above steps involving depositing the channel film, the obtained channel film may be amorphous or crystalline.

In some embodiments, taking the oxide film in each step as an IGZO layer as an example, the deposition conditions are as follows:

| deposition step | deposited film | ratio of the target materials (In:Ga:Zn) | deposition condition |
|---|---|---|---|
| SA2, SB1, SC1, SD1, SE2, SF12, SF21 | amorphous channel film | 4:2:3 | temperature for forming film: >100° C., oxygen ratio 0~30% |
| | crystalline channel film | 4:2:3 | temperature for forming film: >100° C., oxygen ratio 30~60% ($O_2/(O_2 + Ar)$) |
| SC1, SD1, SE2 | crystalline first matching film | 4:2:3 | temperature for forming film: >100° C., oxygen ratio 60~100% ($O_2/(O_2 + Ar)$) |
| SE2 | crystalline second matching film | 4:2:3 | temperature for forming film: >100° C., oxygen ratio 60~100% ($O_2/(O_2 + Ar)$) |
| SF21 | crystalline first barrier film | 4:2:3 | temperature for forming film: >100° C., oxygen ratio 60~100% ($O_2/(O_2 + Ar)$) |
| SA1, SB2, SC2, SD2, SE3, SF13 | crystalline first barrier film | 1:3:6 | temperature for forming film: >100° C., oxygen ratio 0~50% ($O_2/(O_2 + Ar)$) |
| SD1, SF21 | crystalline second barrier film | 4:2:3 | temperature for forming film: >100° C., oxygen ratio 60~100% (O2/(O2 + Ar)) |
| SE1, SF11 | crystalline second barrier film | 1:3:6 | temperature for forming film: >100° C., oxygen ratio 0~50% (O2/(O2 + Ar)) |

It can be seen from the above table that the crystallinity is controlled by controlling the oxygen ratio; and it can be seen from the above table that the channel film formed in steps SA2, SB1, SC1, SD1, SE2, SF12, SF21 is amorphous or crystalline IGZO (423) film; the first matching film formed in steps SC1, SD1, SE2 is crystalline IGZO (423) film; the second matching film formed in step SE2 is a crystalline IGZO (423) film; the first barrier film formed in step SF21 is a crystalline IGZO (423) film; the first barrier film formed in steps SA1, SB2, SC2, SD2, SE3, SF13 is crystalline IGZO (136) film; the second barrier film formed in steps SD1 and SF21 is crystalline IGZO (423) film; the second barrier film formed in steps SE1 and SF11 is crystalline IGZO (136) film.

As shown in FIG. 7A to FIG. 7G, the active layer ACT further includes a sacrificial layer SAC provided on the side of the multiple oxide layers MOL facing away from the substrate BS, and the sacrificial layer SAC has better wettability to the photoresist than the wettability of the surface of the multiple oxide layers MOL farthest from the substrate BS to the photoresist; the sacrificial layer SAC and the multiple oxide layers MOL are fabricated by using the one single mask.

In some embodiments, the forming the sacrificial layer SAC and the multiple oxide layers MOL includes the following steps: sequentially forming the multiple oxide films and the sacrificial film on the substrate BS; coating a photoresist layer on the multiple oxide films and the sacrificial film; exposing the photoresist layer by using one single mask; developing the exposed photoresist layer to form a photoresist pattern; perform an etching process by using the photoresist pattern to form the multiple oxide layers MOL and the sacrificial layer SAC.

In some embodiments, the sacrificial layer SAC and the multiple oxide layers MOL are formed by multiple etchings. For example, during the etching process, the sacrificial film is first etched by using the photoresist pattern to obtain the sacrificial layer SAC, and then the multiple oxide films are etched by using the sacrificial layer SAC as a mask to obtain the multiple oxide layers MOL.

In other embodiments, the sacrificial layer SAC and the multiple oxide layers MOL are formed by the one single etching. For example, during the etching process, the sacrificial film and the multiple oxide films are etched together by using the photoresist pattern as a mask (i.e., the single etching) to obtain the sacrificial layer SAC and the multiple oxide layers MOL, respectively.

The inventors of the present disclosure notice in research that in the case where the sacrificial layer SAC and the multiple oxide layers MOL are formed in the manner of the above-mentioned multiple etchings, it is possible that the multiple oxide layers MOL are drilled. In view of this, for example, the sacrificial layer SAC and the multiple oxide layers MOL are formed in the manner of the above-mentioned single etching.

In addition, the manufacturing method of the thin film transistor further includes the steps of forming the gate electrode GE, the first inorganic insulating layer GI, the source electrode SE and the drain electrode DE, and the second inorganic insulating layer PVX. For example, taking the thin film transistor shown in FIG. 1A to FIG. 1F as an example, the manufacturing method provided by some embodiments of the present disclosure include: forming the gate electrode GE on the substrate BS; forming the first inorganic insulating layer GI on the gate electrode GE; forming the active layer ACT on the first inorganic insulating layer GI; forming the source electrode SE and the drain electrode DE on the active layer ACT; and then forming the second inorganic insulating layer PVX. For example, the forming the source electrode SE and the drain electrode DE includes: forming a source-drain metal film on the active layer ACT; coating a photoresist on the source-drain metal film; exposing the photoresist by using a mask; developing the exposed photoresist to form a photoresist pattern; and then, performing an etching process on the source and drain metal film by using the photoresist pattern to form the source electrode SE and the drain electrode DE.

The components, which are same as those in the above-mentioned embodiments of the thin film transistor, in the above-mentioned embodiments of the manufacturing method of the thin film transistor may be arranged in the manner same as those in the above-mentioned embodiments of the thin film transistor, thus the descriptions will not be repeated here.

Furthermore, the features in the embodiments or examples of the present disclosure may be combined with each other without conflict.

What is described above is related to only the illustrative embodiments of the present disclosure and not limitative to the protection scope of the present disclosure. The protection scope of the present disclosure shall be defined by the accompanying claims.

The invention claimed is:

1. A thin film transistor, comprising: a substrate and an active layer provided on the substrate, wherein
   the active layer comprises multiple oxide layers arranged in a stack, the multiple oxide layers comprise a channel layer, a transition layer, and a first barrier layer, the channel layer is a layer with a highest carrier mobility in the multiple oxide layers, the channel layer is a crystalline oxide layer or an amorphous oxide layer, the transition layer is in direct contact with the channel layer, the first barrier layer is an outermost oxide layer in the multiple oxide layers, and the first barrier layer and the transition layer are both crystalline oxide layers;
   a crystallization degree of the first barrier layer and a crystallization degree of the transition layer are both greater than a crystallization degree of the channel layer, and a band gap of the first barrier layer and a band gap of the transition layer are both larger than a band gap of the channel layer;
   the transition layer is a first matching layer provided between the channel layer and the first barrier layer;
   a carrier concentration of the first matching layer is between a carrier concentration of the channel layer and a carrier concentration of the first barrier layer;
   a carrier mobility of the first matching layer is between a carrier mobility of the channel layer and a carrier mobility of the first barrier layer; and
   a thickness of the first matching layer and a thickness of the channel layer are both smaller than a thickness of the first barrier layer.

2. The thin film transistor of claim 1, wherein a slope angle of the multiple oxide layers is in a range of 25°-65°.

3. The thin film transistor according to claim 1, wherein the first matching layer and the channel layer comprise same kinds of metal elements, and an atomic number ratio of the metal elements in the first matching layer and an atomic number ratio of the metal elements in the channel layer are the same.

4. The thin film transistor according to claim 1, wherein the first barrier layer and the first matching layer comprise same kinds of metal elements, and an atomic number ratio of the metal elements in the first barrier layer and an atomic number ratio of the metal elements in the first matching layer are different from each other.

5. The thin film transistor according to claim 1, wherein both the first matching layer and the first barrier layer are provided on a side of the channel layer facing away from the substrate, the channel layer is an amorphous or crystalline IGZO layer, the first matching layer and the first barrier layer are both crystalline IGZO layers, and In: Ga: Zn in each of the channel layer and the first matching layer is 4:2:3, and In: Ga: Zn in the first barrier layer is 1:3:6.

6. The thin film transistor according to claim 1, wherein the multiple oxide layers further comprise a second barrier layer, the second barrier layer is provided on a side of the channel layer facing towards the substrate, the first barrier layer is provided on a side of the channel layer facing away from the substrate, and a band gap of the second barrier layer is larger than the band gap of the channel layer.

7. The thin film transistor of claim 6, wherein the second barrier layer is a crystalline oxide layer, a crystallization degree of the second barrier layer is greater than the crystallization degree of the channel layer, the second barrier layer and the channel layer comprise same kinds of metal elements, and an atomic number ratio of the metal elements in the second barrier layer and an atomic number ratio of the metal elements in the channel layer are the same.

8. The thin film transistor according to claim 6, wherein the channel layer is a crystalline or amorphous IGZO layer, the second barrier layer, the first matching layer, and the first barrier layer are all crystalline IGZO layers, In: Ga: Zn in each of the second barrier layer, the channel layer, and the first matching layer is 4:2:3, and In: Ga: Zn in the first barrier layer is 1:3:6.

9. The thin film transistor according to claim 6, wherein the multiple oxide layers further comprise a second matching layer provided between the channel layer and the second barrier layer, the second matching layer is a crystalline oxide layer, a crystallization degree of the second matching layer is between the crystallization degree of the channel layer and a crystallization degree of the second barrier layer, the second matching layer, the channel layer, and the first matching layer comprise same kinds of metal elements and have a same atomic number ratio, and a thickness of the second matching layer is greater than a thickness of the first matching layer.

10. The thin film transistor according to claim 9, wherein the channel layer is an amorphous or crystalline IGZO layer, the second barrier layer, the second matching layer, the first matching layer, and the first barrier layer are all crystalline IGZO layers, In: Ga: Zn in each of the second matching layer, the channel layer, and the first matching layer is 4:2:3, and In: Ga: Zn in each of the first barrier layer and the second barrier layer is 1:3:6.

11. The thin film transistor according to claim 1, wherein the transition layer is a second barrier layer, the second barrier layer is provided on a side of the channel layer facing towards the substrate, the first barrier layer is provided on a side of the channel layer facing away from the substrate, and a band gap of the second barrier layer is larger than the band gap of the channel layer.

12. The thin film transistor of claim 11, wherein the multiple oxide layers are three oxide layers which comprise the second barrier layer, the channel layer, and the first barrier layer, wherein the first barrier layer, the channel layer, and the second barrier layer comprise same kinds of metal elements, and an atomic number ratio of metal elements in the first barrier layer, an atomic number ratio of the metal elements in the channel layer, and an atomic number ratio of the metal elements in the second barrier layer are the same.

13. The thin film transistor according to claim 11, wherein the channel layer is an amorphous or crystalline IGZO layer, the second barrier layer and the first barrier layer are both crystalline IGZO layers, In: Ga: Zn in each of the second barrier layer, the channel layer, and the first barrier layer is 4:2:3.

14. The thin film transistor of claim 11, wherein the multiple oxide layers are three oxide layers which comprises the second barrier layer, the channel layer, and the first barrier layer, wherein the channel layer is an amorphous or crystalline IGZO layer, the first barrier layer and the second barrier layer are both crystalline IGZO layers, and In: Ga: Zn in the channel layer is 4:2:3, In: Ga: Zn in each of the second barrier layer and the first barrier layer is 1:3:6.

15. The thin film transistor according to claim 1, wherein the first barrier layer is provided on a side of the channel layer facing away from the substrate, and a wettability of the first barrier layer to a photoresist is better than a wettability of a layer, which is in direct contact with the first barrier layer in the multiple oxide layers, to the photoresist.

16. The thin film transistor according to claim 1, wherein the active layer further comprises a sacrificial layer stacked with the multiple oxide layers, the sacrificial layer is provided on a side of the multiple oxide layers facing away from the substrate, a wettability of the sacrificial layer to a photoresist is better than a wettability of a surface of the multiple oxide layers in direct contact with the sacrificial layer to the photoresist.

17. The thin film transistor of claim 16, wherein the thin film transistor further comprises a source electrode and a drain electrode on the substrate, the source electrode and the drain electrode are provided on a side of the sacrificial layer facing away from the substrate, the sacrificial layer is disconnected at a position between the source electrode and the drain electrode, a thickness of the sacrificial layer is less than or equal to 100 angstroms, and the sacrificial layer is selected from the group consisting of a metal oxide semiconductor layer and a metal sulfide semiconductor layer.

18. An array substrate, comprising
a display region and a gate driving circuit region on a periphery of the display region, and a plurality of thin film transistors, each of the plurality of thin film transistors comprises:
a substrate and an active layer provided on the substrate, wherein
the active layer comprises multiple oxide layers arranged in a stack, the multiple oxide layers comprise a channel layer, a transition layer, and a first barrier layer, the channel layer is a layer with a highest carrier mobility in the multiple oxide layers, the channel layer is a crystalline oxide layer or an amorphous oxide layer, the transition layer is in direct contact with the channel layer, the first barrier layer is an outermost oxide layer in the multiple oxide layers, and the first barrier layer and the transition layer are both crystalline oxide layers;
a crystallization degree of the first barrier layer and a crystallization degree of the transition layer are both greater than a crystallization degree of the channel layer, and a band gap of the first barrier layer and a band gap of the transition layer are both larger than a band gap of the channel layer;
the transition layer is a first matching layer provided between the channel layer and the first barrier layer, a carrier concentration of the first matching layer is between a carrier concentration of the channel layer and a carrier concentration of the first barrier layer, a carrier mobility of the first matching layer is between a carrier mobility of the channel layer and a carrier mobility of the first barrier layer, and a thickness of the first matching layer and a thickness of the channel layer are both smaller than a thickness of the first barrier layer; and
the plurality of thin film transistors comprise a first thin film transistor in the display region and a second thin film transistor in the gate driving circuit region, a width-to-length ratio of the second thin film transistor is 12~150 times a width-to-length ratio of the first thin film transistor.

19. The array substrate according to claim 18, wherein the width-to-length ratio of the first thin film transistor is 0.5~2, the width-to-length ratio of the second thin film transistor is 12.5~118, a width of the second thin film transistor is 1~500 times a width of the first thin film transistor, and a length of the second thin film transistor is 1.5 to 2 times a length of the first thin film transistor.

20. An array substrate, comprising a thin film transistor, wherein the thin film transistor comprises a substrate and an active layer provided on the substrate, wherein
the active layer comprises multiple oxide layers arranged in a stack, the multiple oxide layers comprise a channel layer, a transition layer, and a first barrier layer, the channel layer is a layer with a highest carrier mobility in the multiple oxide layers, the channel layer is a crystalline oxide layer or an amorphous oxide layer, the transition layer is in direct contact with the channel layer, the first barrier layer is an outermost oxide layer in the multiple oxide layers, and the first barrier layer and the transition layer are both crystalline oxide layers;
a crystallization degree of the first barrier layer and a crystallization degree of the transition layer are both greater than a crystallization degree of the channel layer, and a band gap of the first barrier layer and a band gap of the transition layer are both larger than a band gap of the channel layer;
the transition layer is a first matching layer provided between the channel layer and the first barrier layer,
a carrier concentration of the first matching layer is between a carrier concentration of the channel layer and a carrier concentration of the first barrier layer,
a carrier mobility of the first matching layer is between a carrier mobility of the channel layer and a carrier mobility of the first barrier layer, and
a thickness of the first matching layer and a thickness of the channel layer are both smaller than a thickness of the first barrier layer.

* * * * *